(12) United States Patent  
Yu et al.

(10) Patent No.: US 11,499,248 B2
(45) Date of Patent: Nov. 15, 2022

(54) ELECTRIC FIELD DRIVEN ASSEMBLY OF ORDERED NANOCRYSTAL SUPERLATTICES

(71) Applicant: LAWRENCE LIVERMORE NATIONAL SECURITY, LLC, Livermore, CA (US)

(72) Inventors: Yixuan Yu, Livermore, CA (US); Joshua D. Kuntz, Livermore, CA (US); Christine A. Orme, Oakland, CA (US); Andrew J. Pascall, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 580 days.

(21) Appl. No.: 16/491,849

(22) PCT Filed: Feb. 9, 2018

(86) PCT No.: PCT/US2018/017686
  § 371 (c)(1),
  (2) Date: Sep. 6, 2019

(87) PCT Pub. No.: WO2018/169627
  PCT Pub. Date: Sep. 20, 2018

(65) Prior Publication Data
  US 2021/0140068 A1  May 13, 2021

Related U.S. Application Data

(60) Provisional application No. 62/471,477, filed on Mar. 15, 2017.

(51) Int. Cl.
  *C30B 30/02* (2006.01)
  *C25D 13/12* (2006.01)
  (Continued)

(52) U.S. Cl.
  CPC .............. *C30B 30/02* (2013.01); *C25D 13/12* (2013.01); *C30B 29/02* (2013.01); *C30B 29/54* (2013.01);
  (Continued)

(58) Field of Classification Search
  CPC ........... B82Y 40/00; B82Y 30/00; B82B 3/00; C30B 29/68; C30B 29/605; Y10S 977/76;
  (Continued)

(56) References Cited

U.S. PATENT DOCUMENTS

| | | | | |
|---|---|---|---|---|
| 7,455,757 B2 * | 11/2008 | Oh | ......................... | B82Y 10/00 204/490 |
| 7,850,874 B2 * | 12/2010 | Lu | ........................... | H01J 1/304 977/749 |
| 7,887,689 B2 * | 2/2011 | Zhou | ...................... | B82Y 30/00 204/491 |
| 8,629,422 B2 * | 1/2014 | Ryan | ...................... | C25D 13/02 977/773 |

(Continued)

FOREIGN PATENT DOCUMENTS

KR  10-1266922 B1  5/2013

OTHER PUBLICATIONS

International Search Report and Written Opinion for PCT/US2018/017686, 9 pages.

*Primary Examiner* — Jaehwan Oh
(74) *Attorney, Agent, or Firm* — Eddie E. Scott

(57) ABSTRACT

An electric field drives nanocrystals dispersed in solvents to assemble into ordered three-dimensional superlattices. A first electrode and a second electrode 214 are in the vessel. The electrodes face each other. A fluid containing charged nanocrystals fills the vessel between the electrodes. The electrodes are connected to a voltage supply which produces an electrical field between the electrodes. The nanocrystals will migrate toward one of the electrodes and accumulate on the electrode producing ordered nanocrystal accumulation that will provide a superlattice thin film, isolated superlattice islands, or coalesced superlattice islands.

18 Claims, 21 Drawing Sheets

(51) Int. Cl.
*C30B 29/02* (2006.01)
*C30B 29/54* (2006.01)
*C30B 29/68* (2006.01)
*C30B 33/02* (2006.01)
*H01L 31/0352* (2006.01)
*B82Y 30/00* (2011.01)
*B82Y 40/00* (2011.01)

(52) U.S. Cl.
CPC ............. *C30B 29/68* (2013.01); *C30B 33/02* (2013.01); *H01L 31/035236* (2013.01); *B82Y 30/00* (2013.01); *B82Y 40/00* (2013.01)

(58) Field of Classification Search
CPC ............. Y10S 977/761; Y10S 977/762; Y10S 977/932
See application file for complete search history.

(56) References Cited

U.S. PATENT DOCUMENTS

| | | | |
|---|---|---|---|
| 10,359,362 B2 * | 7/2019 | Kim | G01N 21/554 |
| 10,685,766 B2 * | 6/2020 | Chen | H01B 1/023 |
| 2001/0003681 A1 | 6/2001 | Gal-Or et al. | |
| 2004/0055892 A1 * | 3/2004 | Oh | C25D 15/00 |
| | | | 205/109 |
| 2005/0074911 A1 * | 4/2005 | Kornilovich | C25D 1/04 |
| | | | 438/20 |
| 2010/0135937 A1 | 6/2010 | O'Brien et al. | |
| 2011/0193054 A1 * | 8/2011 | Ryan | C25D 13/12 |
| | | | 977/762 |
| 2013/0240787 A1 | 9/2013 | Chen et al. | |
| 2013/0260113 A1 * | 10/2013 | Hart | B32B 3/22 |
| | | | 428/201 |

\* cited by examiner

See FIG 7C

ELECTRIC FIELD DRIVEN ASSEMBLY OF ORDERED NANOCRYSTAL SUPERLATTICES

CROSS-REFERENCE TO RELATED APPLICATIONS

This application claims priority to and benefit under 35 U.S.C. § 119(e) of U.S. Provisional Patent Application No. 62/471,477 filed Mar. 15, 2017 entitled "electric field driven assembly of ordered nanocrystal superlattices," the content of which is hereby incorporated by reference in its entirety for all purposes.

STATEMENT AS TO RIGHTS TO APPLICATIONS MADE UNDER FEDERALLY SPONSORED RESEARCH AND DEVELOPMENT

The United States Government has rights in this application pursuant to Contract No. DE-AC52-07NA27344 between the United States Department of Energy and Lawrence Livermore National Security, LLC for the operation of Lawrence Livermore National Laboratory.

BACKGROUND OF THE INVENTION

Field of Endeavor

The United States Government has rights in this invention pursuant to Contract No. DE-AC52-07NA27344 between the United States Department of Energy and Lawrence Livermore National Security, LLC for the operation of Lawrence Livermore National Laboratory.

The present application relates to nanocrystal superlattices and more particularly to electric field driven assembly of ordered nanocrystal superlattices. The present invention also relates to the formation of ordered arrays of nanocrystals, and in particular, a process to apply patterned or unpatterned nanocrystal films of a wide variety of materials to a substrate. The present invention also relates to nanostructures, processes for manipulating nanostructures, processes for manipulating nanostructures and devices prepared using nanostructures.

State of Technology

This section provides background information related to the present disclosure which is not necessarily prior art.

Ordered arrays composed of nanocrystals are emerging materials that have wide spread potential applications in photodetectors, light emitting devices, displays, solid state lasers, solar cells, thermoelectric devices, detectors, field effect transistors, and memory devices. It is expected that tailoring the properties of the individual nanocrystal building blocks and the coupling between building blocks will lead to a broad range of device functionalities. For example, the optoelectronic properties of semiconducting nanocrystals (also termed quantum dots) have been shown to be tunable by changing the size, shape, composition and surface functionalization. Tuning these properties provides means of optimizing the absorption and emission spectra of electromagnetic radiation for specific applications. The coupling or communication between nanocrystals is equally important. Communication between nanocrystals may take the form, for example, of electron, hole, phonon, plasmon, or mignon transport.

The realization of improved devices composed of nanocrystals relies on effective methods to deposit nanocrystals into two- and three-dimensional ordered arrays. The degree of order in the superlattices is crucial for their applications because it both increases packing density and plays a central role in transport. Ordering increases the nanocrystal packing density in the assembly, which therefore has improved transport properties including electrical conductivity. In addition, if the spacing is sufficiently small, charge carriers can delocalize leading to miniband formation, which in turn enhances the efficiency of and transport within nanocrystal devices. Reports have demonstrated improved carrier mobility for two-dimensional, ordered arrays, which would likely boost the device efficiency.

A process that can produce large scale ordered nanocrystal superlattices is therefore greatly desired. It is important that the process is suitable for a broad range of nanocrystal sizes, shapes, compositions, and surface functionalization. Also, a process that can produce large scale ordered nanocrystal superlattices within a time period that is suitable for manufacturing is greatly desired.

Although nanocrystal superlattices have been intensively studied for more than two decades, their fabrication methods are still limited. Three-dimensional nanocrystal superlattices are currently fabricated either by (1) solvent evaporation processes or (2) methods that reduce the solubility of the nanocrystal thereby destabilizing the colloidal suspension. Examples of solvent evaporation techniques are dip coating, spin coating, spray coating, drop casting, and ink jet printing. Examples of controlled destabilization are slow titration of an anti-solvent or ligand exchange with a less soluble ligand.

These methods have shortcomings for industrial scale production. One can either let solvents evaporate to increase the concentration of nanocrystals until the entropy driven self-assembly, also known as the Kirkwood-Alder transition, takes place or alter the composition of the solvent or surface functionalization to decrease the solubility of nanocrystals, leading to aggregation or self-assembly.

Current fabrication of superlattices often runs into a dilemma where fast fabrication results in disordered or poorly ordered structures and highly ordered superlattices require fairly slow growth. For example, it usually takes a few days or weeks for solvent evaporation or destabilization methods to generate faceted three-dimensional superlattices (also known as colloidal crystals or supercrystals). In addition, current methods do not guide the nucleation sites and thus are not amenable to patterning as needed for integration into device structures. Another issue is that current methods cannot preferentially crystalize nanocrystals of a specific size and thus require monodisperse starting nanocrystals, typically with less than 10% polydispersity; this requirement constrains nanocrystal synthesis and often adds size-selection steps to processing. Collective properties, for example, electrical/thermal conductivity, of nanocrystal superlattices are affected by scattering and thus are functions of the range over which the nanocrystals are ordered. The size of ordered domains made by solvent evaporation or destabilization methods depends on complex parameters, such as superlattice formation rate and drying conditions, and therefore cannot be readily and systematically controlled, making current methods cumbersome for controlling nucleation density and ordered domain size.

SUMMARY

Features and advantages of the disclosed apparatus, systems, and methods will become apparent from the following description. Applicant is providing this description, which includes drawings and examples of specific embodiments, to give a broad representation of the apparatus, systems, and methods. Various changes and modifications within the spirit and scope of the application will become apparent to those skilled in the art from this description and by practice of the apparatus, systems, and methods. The scope of the apparatus, systems, and methods is not intended to be limited to the particular forms disclosed and the application covers all modifications, equivalents, and alternatives falling within the spirit and scope of the apparatus, systems, and methods as defined by the claims.

The inventors' apparatus, systems, and methods create ordered arrays of nanocrystals, and in particular, a process to apply patterned or unpatterned nanocrystal films of a wide variety of materials to a substrate. The inventors' apparatus, systems, and methods have use in photodetectors, light emitting devices, displays, solid state lasers, solar cells, thermoelectric devices, detectors, field effect transistors, and memory devices.

The inventors' apparatus, systems, and methods utilize electric fields to drive nanocrystals dispersed in solvents to assemble into ordered three-dimensional superlattices. Compared to current fabrication methods of nanocrystal superlattices, the inventors' electrical field driven assembly requires less time, wastes less material, is reversible, and provides more tunability to the final product. For instance, the density, degree of order, and lattice constant can be readily controlled by tuning the strength of electrical fields used to drive the assembly. In addition, the morphology can be changed from conformal thin film geometries to isolated islands to coalesced islands by altering the nanocrystal functionalization and deposition conditions. The fabrication method can be used for a broad range of materials including metals, semiconductors, and insulators.

One embodiment of the inventor's method for manufacturing of superlattices comprises the steps of i) providing a solution of dispersed nanocrystals that are statically or intermittently charged; ii) exposing at least two conducting substrates to the solution in a geometry that allows an electric field to be generated by iii) establishing electrical connection between electrodes and a source meter; iv) applying a voltage with a choice of field strength, temperature, and time; v) removing the electrodes from the solution with the field on; vi) evaporation of the solvent; vii) removing voltage by turning source meter off; and viii) optional post-processing steps such as heating to remove nanocrystal surface functionalization or sintering. The time needed to create ordered superlattice can be as short as 2 min.

The apparatus, systems, and methods are susceptible to modifications and alternative forms. Specific embodiments are shown by way of example. It is to be understood that the apparatus, systems, and methods are not limited to the particular forms disclosed. The apparatus, systems, and methods cover all modifications, equivalents, and alternatives falling within the spirit and scope of the application as defined by the claims.

BRIEF DESCRIPTION OF THE DRAWINGS

The accompanying drawings, which are incorporated into and constitute a part of the specification, illustrate specific embodiments of the apparatus, systems, and methods and, together with the general description given above, and the detailed description of the specific embodiments, serve to explain the principles of the apparatus, systems, and methods.

FIG. 6B illustrates an example embodiment of the inventor's apparatus with the voltage on.

DETAILED DESCRIPTION OF SPECIFIC EMBODIMENTS

Figure 1:
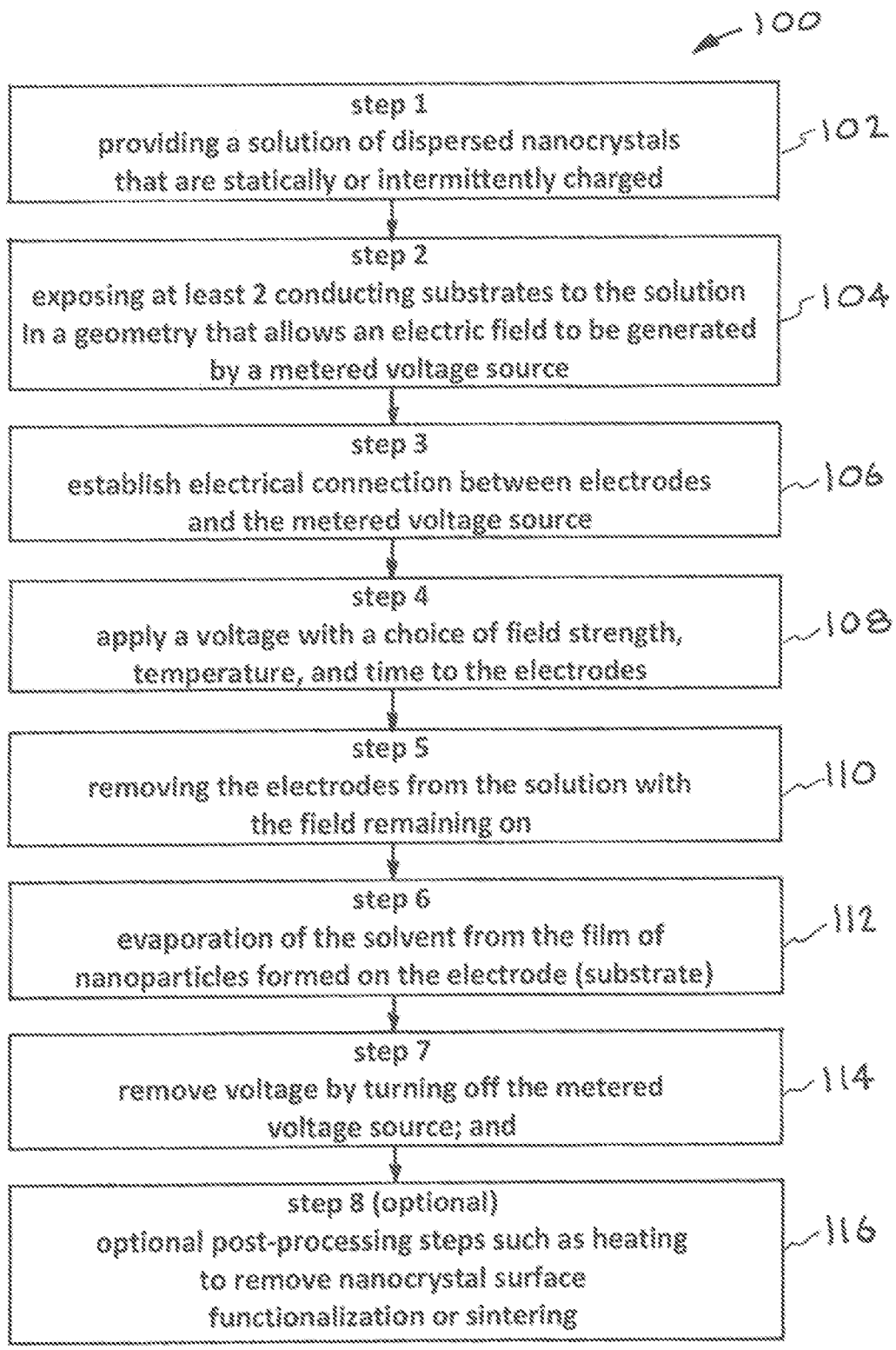
FIG. 1 is a flow chart illustrating one illustrative embodiment of the inventor's electric field driven assembly of ordered nanocrystal superlattices.

Referring to the drawings, to the following detailed description, and to incorporated materials, detailed information about the apparatus, systems, and methods is provided including the description of specific embodiments. The detailed description serves to explain the principles of the apparatus, systems, and methods. The apparatus, systems, and methods are susceptible to modifications and alternative forms. The application is not limited to the particular forms disclosed. The application covers all modifications, equivalents, and alternatives falling within the spirit and scope of the apparatus, systems, and methods as defined by the claims.

The present invention creates ordered assemblies of nanocrystals quickly and at low cost. Products made using the invented method have a higher degree of order and their properties can be more systematically controlled compared with materials made with conventional methods. The invented method also facilitates the patterning and integration into complex device architectures.

Definitions

The term "thin film" as used in this application means "a film having a thickness of twenty (20) nanocrystals or less."

Flow Chart

Referring now to the drawings and in particular to FIG. 1, a flow chart illustrates one illustrative embodiment of the inventor's electric field driven assembly of ordered nanocrystal superlattices. The invention applies electric fields to a nanocrystal solution to accumulate charged nanocrystals, regardless of their size, shape, and composition, to an electrode, where the nanocrystal become neutralized and assemble into ordered assemblies, also known as superlattices. The electric field can be created between two electrodes by supplying a voltage to the electrodes with a commercial source meter. The source meter can be any instrument that can generate an electrical voltage. The electrodes can have any shape and be made from any material that allows charge transport. The two electrodes can be made with the same materials or different materials. Although we refer to the particles as nanocrystals, they need not be crystalline but could be amorphous. Nanocrystals covered by this approach include, but are not limited to, metallic nanocrystals, semiconducting nanocrystals (also known as quantum dots), and insulating nanocrystals, or a combination of those. The nanocrystal is composed of a core and an optional coating (referred to as surface functionalization or ligands) that renders the nanocrystal dispersible in the solvent and, in some cases, may play a role in charge transfer. This invention does require the nanocrystals to be charged. The nanocrystals may be positively or negatively charged, and the charge may be intermittent due to interactions with its environment. The nanocrystal solution is formed by dispersing nanocrystals in a carrier fluid of any kind.

The invented method is schematically illustrated in FIG. 1 and described in more detail in Examples 1 to 15. The overall system is designated generally by the reference numeral 100. The system 100 includes the following steps:

Step #1 (102)—providing a solution of dispersed nanocrystals that are statically or intermittently charged;

Step #2 (104)—exposing at least two conducting substrates to the solution in a geometry that allows an electric field to be generated by a metered voltage source;

Step #3 (106)—establishing electrical connection between electrodes and the metered voltage source;

Step #4 (108)—applying a voltage with a choice of field strength, temperature, and time to the electrodes;

Step #5 (110)—removing the electrodes from the solution with the field remaining on;

Step #6 (112)—evaporation of the solvent from the film of nano-particles formed on the electrode (substrate);

Step #7 (114)—remove voltage by turning off the metered voltage source; and

Step #8 (116)—optional post-processing steps such as heating to remove nanocrystal surface functionalization or sintering (optional step).

The time needed to create ordered superlattices can be as short as 2 min.

Alternate embodiments use steps 1) to 5) and then either dip or use a flow geometry to expose the wet surface to another chemistry either with or without an electric field. Commonly this last step serves to change the solubility of the nanocrystals on the substrate so that the process can be successively repeated with the same or different nanocrystal solutions.

Alternate embodiments use steps 1) to 6) and then either dip or use a flow geometry to expose the dry surface to another chemistry either with or without an electric field. Commonly this last step serves to change the solubility of the nanocrystals on the substrate so that the process can be successively repeated with the same or different nanocrystal solutions.

Alternate embodiments replace one or more of the electrodes with a patterned electrode composed of conducting and non-conducting regions or pads.

The inventors' apparatus, systems, and methods have many advantages including the advantages listed and described below. The invented method provides a higher degree of control over the growth and a greater tunability of the final product, including the advantages listed and then described below.

(1) The invented method provides a means to control the morphology of the films from conformal thin film geometries to isolated islands to coalesced islands.

(2) The invented method provides a means to alter the nanocrystal density.

(3) The invented method provides a means to control the degree of order.

(4) The invented method provides a means to control the density of nucleated islands and thereby the average supercrystal grain size.

(5) The invented method provides a means to select the nanocrystal size that is deposited within the superlattice.

(6) The invented method provides a means to control the growth rate of the superlattice.

(7) The invented method provides a means to pattern the superlattice and hence integrate nanocrystal superlattices within device structures.

(8) The invented method provides a means to deposit superlattices on curved or shaped parts.

(9) With a flow apparatus or sequential dipping, the invented method provides a means to change the capping ligands.

(10) With a flow apparatus or sequential dipping, the invented method provides a means to build up complex structures such as heterojunctions, multilayers and multicomponent structures.

(11) The invented method provides a means to simultaneously deposit more than one type of nanocrystal.

The inventors' apparatus, systems, and methods have many uses. For example, the inventors' apparatus, systems, and methods have use in solar cells, photodetectors, light emitting diodes, displays, laser diodes, photodetectors, memory devices, transistors, field-effect transistors, thermoelectric devices, detectors, memory devices, and other uses.

The present invention is further described and illustrated by a number of examples of apparatus, systems, and methods constructed in accordance with the present invention. Various changes and modifications of these examples will be apparent to those skilled in the art from the description of the examples and by practice of the invention. The scope of the invention is not intended to be limited to the particular examples disclosed and the invention covers all modifications, equivalents, and alternatives falling within the spirit and scope of the invention as defined by the claims.

Example 1. Formation of Superlattices

Figure 2A:
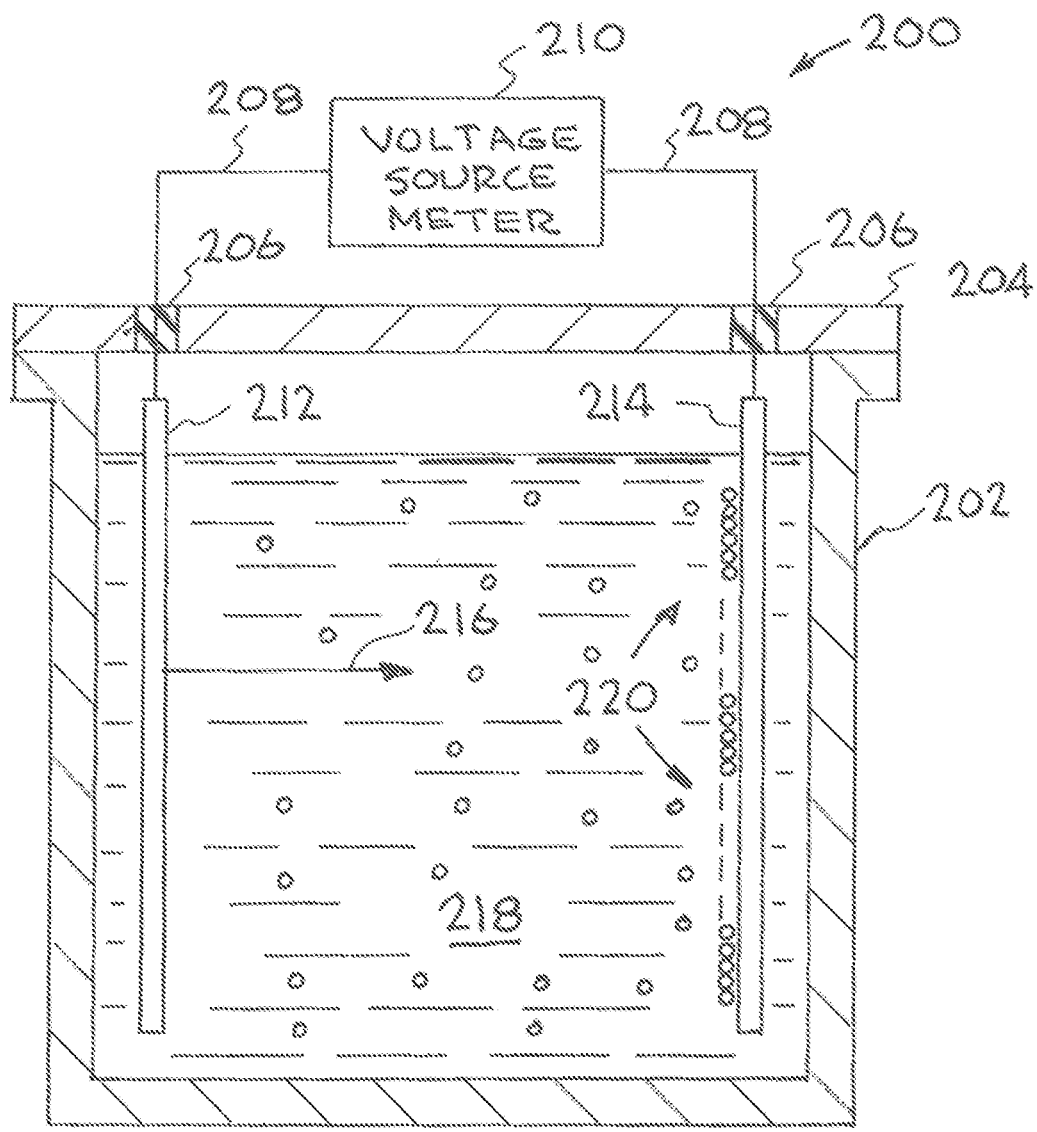
FIG. 2A illustrates an example embodiment of the inventor's apparatus.

Referring now to FIG. 2A, an example embodiment of the inventor's apparatus is illustrated. The apparatus is designated generally by the reference numeral 200. The apparatus is a cell for the electric field driven assembly of ordered nanocrystal superlattices. The apparatus 200 includes the components listed below.

tank 202,
lid 204,
electrical isolation 206,
leads 208,
voltage source meter 210,
positive electrode 212,
negative electrode 214,
electric field direction 216,
solution with nanocrystals 218, and
layer of deposited nanocrystals 220.

The structural components of the inventor's first example embodiment 200 having been described, the operation of first example embodiment 200 will be described. As illustrated in FIG. 2A; electrode 212 and electrode 214 are in the vessel or tank 202. The electrode 212 and electrode 214 face each other. The fluid 218 is contained in the vessel 202. The fluid 218 fills the vessel 202 between electrode 212 and electrode 214. The electrode 212 and electrode 214 are connected to a voltage supply 210 which produces an electrical field 216 between electrode 212 and electrode 214. Depending on the charge of the nanocrystals contained in the fluid 218, the nanocrystals will migrate toward one or both of the electrodes 212 and electrode 214. In the first example embodiment 200 the nanocrystals migrate toward the electrode 214 and accumulate on electrode 214. The nanocrystals are shown forming a nanocrystal accumulation on the electrode 214 producing ordered nanocrystal accumulation 220 that can have the form of a conformal thin film or isolated islands or coalesced islands.

Figure 2B:
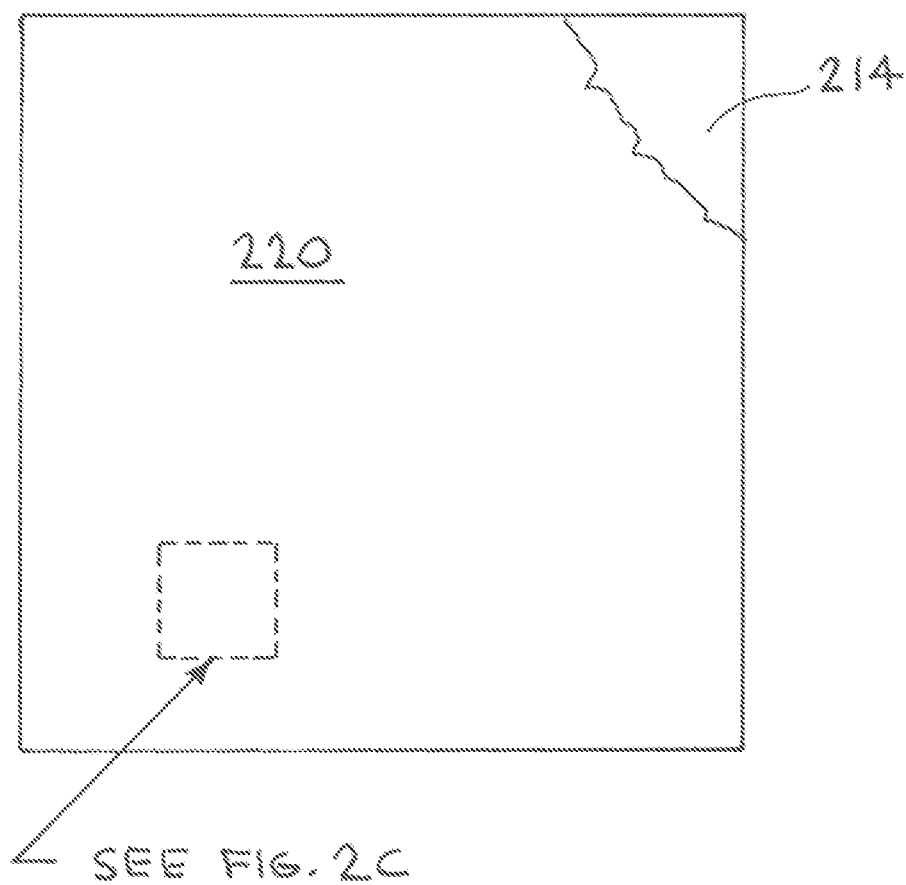
FIG. 2B shows a nanocrystal accumulation on an electrode producing an ordered nanocrystal accumulation that provides a conformal superlattice thin film or isolated superlattice islands or coalesced superlattice islands.

Referring to FIG. 2B, the electrode 214 is shown with the nanocrystal accumulation 220 on the electrode 214. The electrical field has generated electrophoretic forces on the nanocrystals dispersed in the fluid which in turn has driven the nanocrystals toward the electrode 214. This increases the local nanocrystal concentration of the nanocrystal solution and the concentrated nanocrystal solution is subsequently assembled into the nanocrystal accumulation 220 on the electrode 214 producing an ordered nanocrystal accumulation (conformal thin film or isolated islands or coalesced islands). The rate of accumulation of the nanocrystals in the nanocrystal accumulation 220 can be influenced by many factors. Such factors include the electrical field, tuning the strength of the electrical field, the nanocrystal ligand, and the concentration of nanocrystals in the fluid.

Figure 2C:
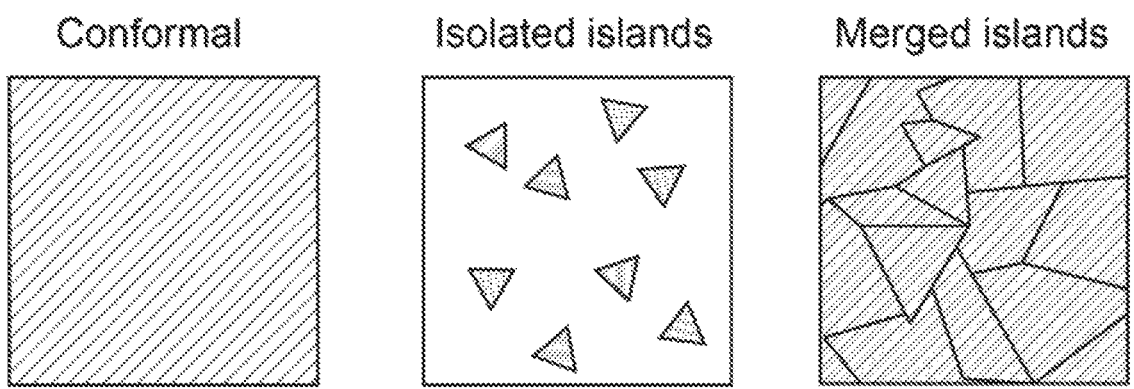
FIG. 2C shows an enlarged portion of the electrode of FIG. 2B with examples of a conformal superlattice thin film or isolated superlattice islands or coalesced superlattice islands.

Referring to FIG. 2C, an enlarged portion of the electrode 214 of FIG. 2B is shown. The enlarged portion of the electrode 214 has the nanocrystal accumulation that includes the nanocrystals 220. The electrical field has generated electrophoretic forces on the nanocrystals dispersed in the fluid which in turn has driven the nanocrystals toward the electrode 214. This increases the local nanocrystal concentration of the nanocrystal solution and the concentrated nanocrystal solution is subsequently assembled into the nanocrystal accumulation 220 on the electrode 214 producing an ordered nanocrystal accumulation in the form of a conformal thin film or isolated islands or coalesced islands.

In preferred embodiments, the nanocrystals are accumulated to an electrode with a similar hydrophobicity. In other words, hydrophobic nanocrystals to hydrophobic electrodes, and hydrophilic nanocrystals to hydrophilic electrodes. This forms nanocrystal superlattices of a face centered cubic (FCC) structure with a packing density of 74%. Packing density is the percentage of volume that is occupied by nanocrystals in their assembly. In another embodiment, with the identical process except hydrophobic nanocrystal are accumulated to a hydrophilic electrode, superlattice with a body centered tetragonal (BCT) structure is formed. BCT structure is less dense than FCC. The packing density of BCT is in the range of 68-74%.

Controlling the Morphology of Superlattices

The present invention allows one to precisely tune the morphology of nanocrystal superlattice by adjusting the parameters of the process, including the type of nanocrystals and nanocrystal surface functionality, applied voltage, electrode spacing, duration of applying voltage, and temperature. Below the formation of thin films, isolated islands and coalesced films are described.

Forming Thin Film Superlattices

In another embodiment nanocrystal solution is prepared by dispersing oleic acid-capped nickel nanocrystals in hexane. Applying a field of 10 V/cm for 5 minutes to this solution leads to the formation of conformal thin films of nanocrystal superlattice.

Figure 3A:
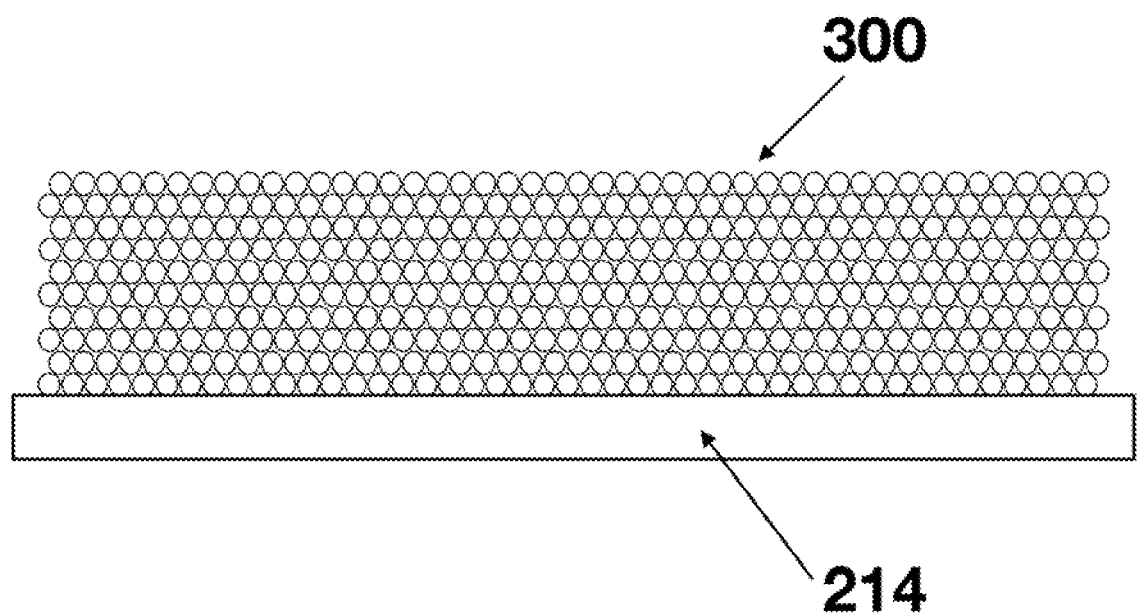
FIG. 3A shows a nanocrystal accumulation on an electrode producing ordered nanocrystal accumulation that provides a superlattice thin film.

Referring to FIG. 3A nanocrystals are shown forming a nanocrystal accumulation on the electrode 214 producing ordered nanocrystal accumulation that will provide a superlattice thin film 300. The electrodes in the vessel or tank face each other. The fluid is contained in the vessel electrodes. The voltage supply produces an electrical field between electrodes. Depending on the charge of the nanocrystals contained in the fluid, the nanocrystals will migrate toward one or both of the electrodes and accumulate on the electrode producing the superlattice thin film 300.

Figure 3B:
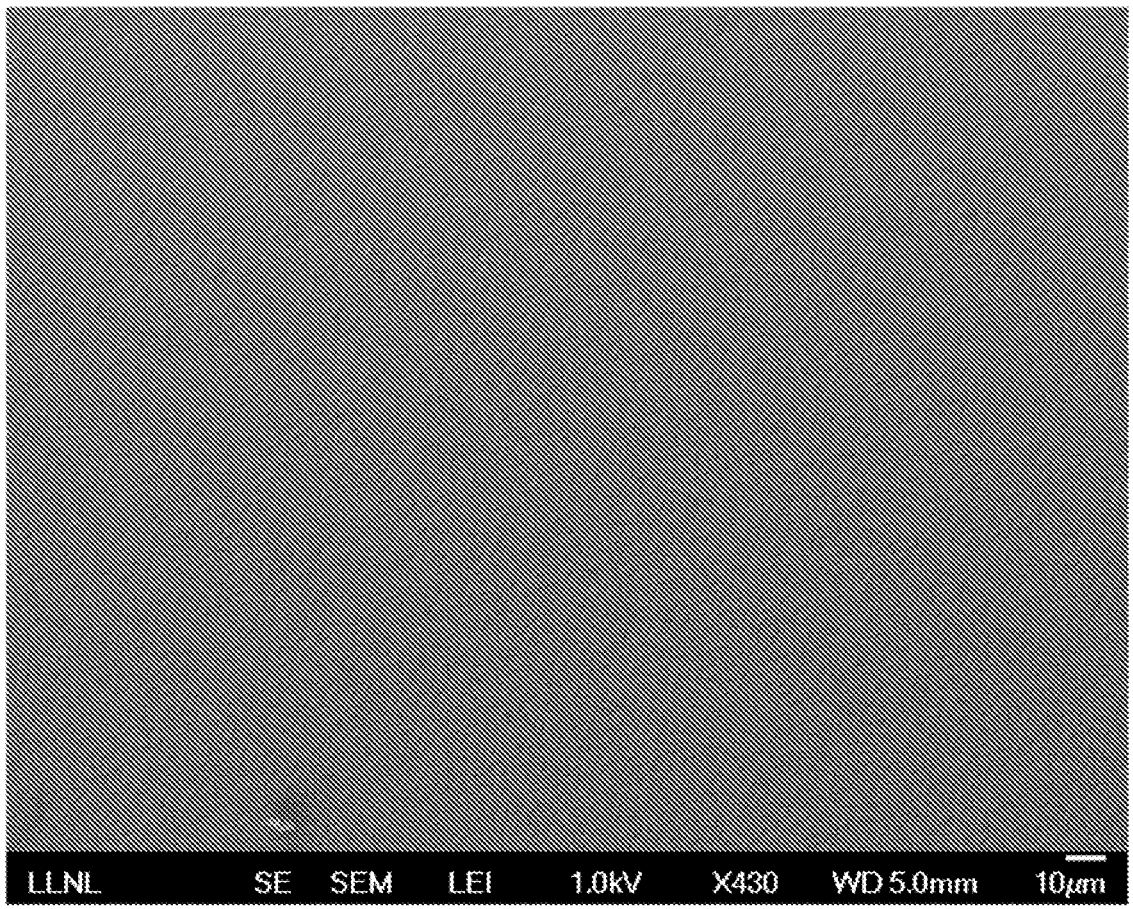
FIG. 3B is a scanning electron microscope (SEM) image of the superlattice thin film of FIG. 3A. (It is to be noted that this SEM image does not show any details of the superlattice thin film because the details are too small. Details are shown in the expanded view FIG. 3C.)
Figure 3C:
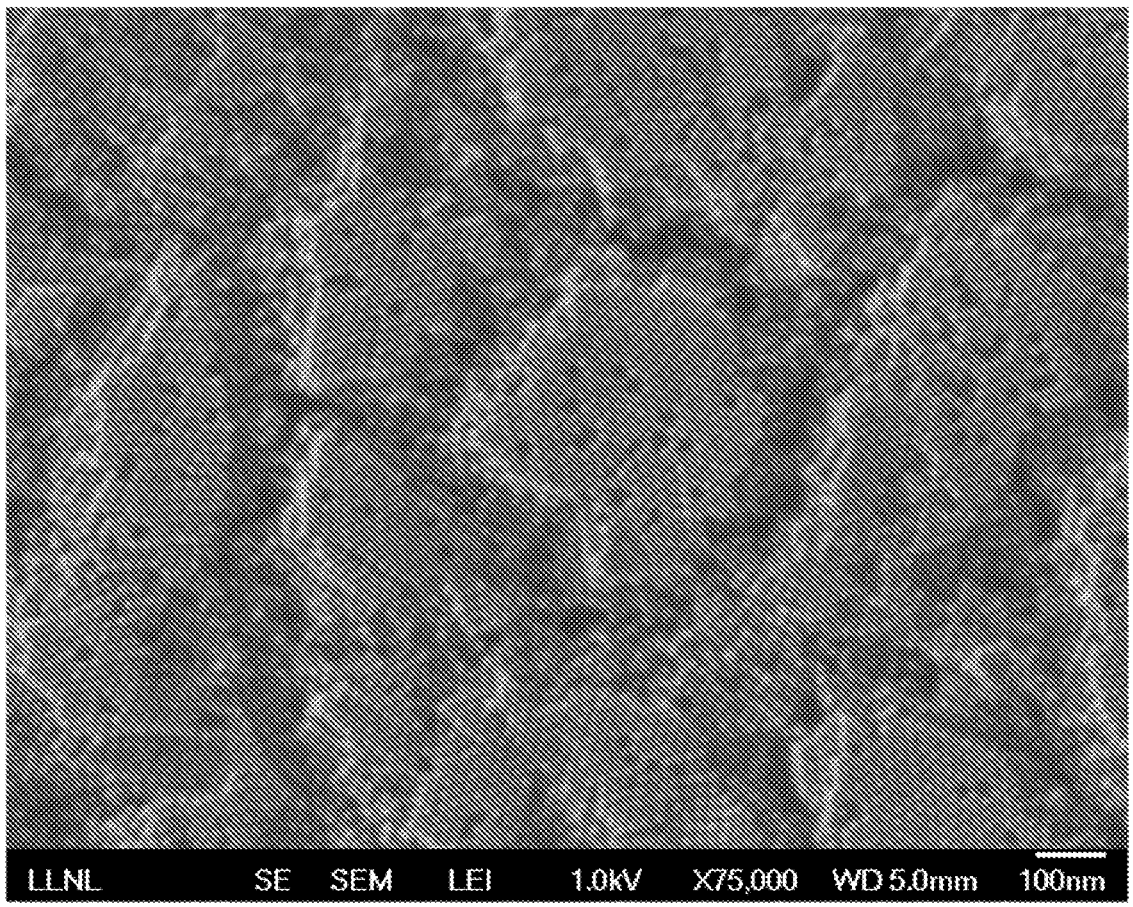
FIG. 3C is a scanning electron microscope (SEM) image of an expanded view of the superlattice thin film of FIG. 3A.

Referring to FIG. 3B a scanning electron microscope (SEM) image shows the superlattice thin film 300 of FIG. 3A. The nanocrystals are shown forming a nanocrystal accumulation on the electrode 214 producing ordered nanocrystal accumulation and providing a superlattice thin film 300. The film is homogeneous and featureless over this area. Referring to FIG. 3C a scanning electron microscope (SEM) image shows an expanded view of the same superlattice thin film of FIG. 3B at a scale where the individual nanocrystals can be seen.

Figure 3D:
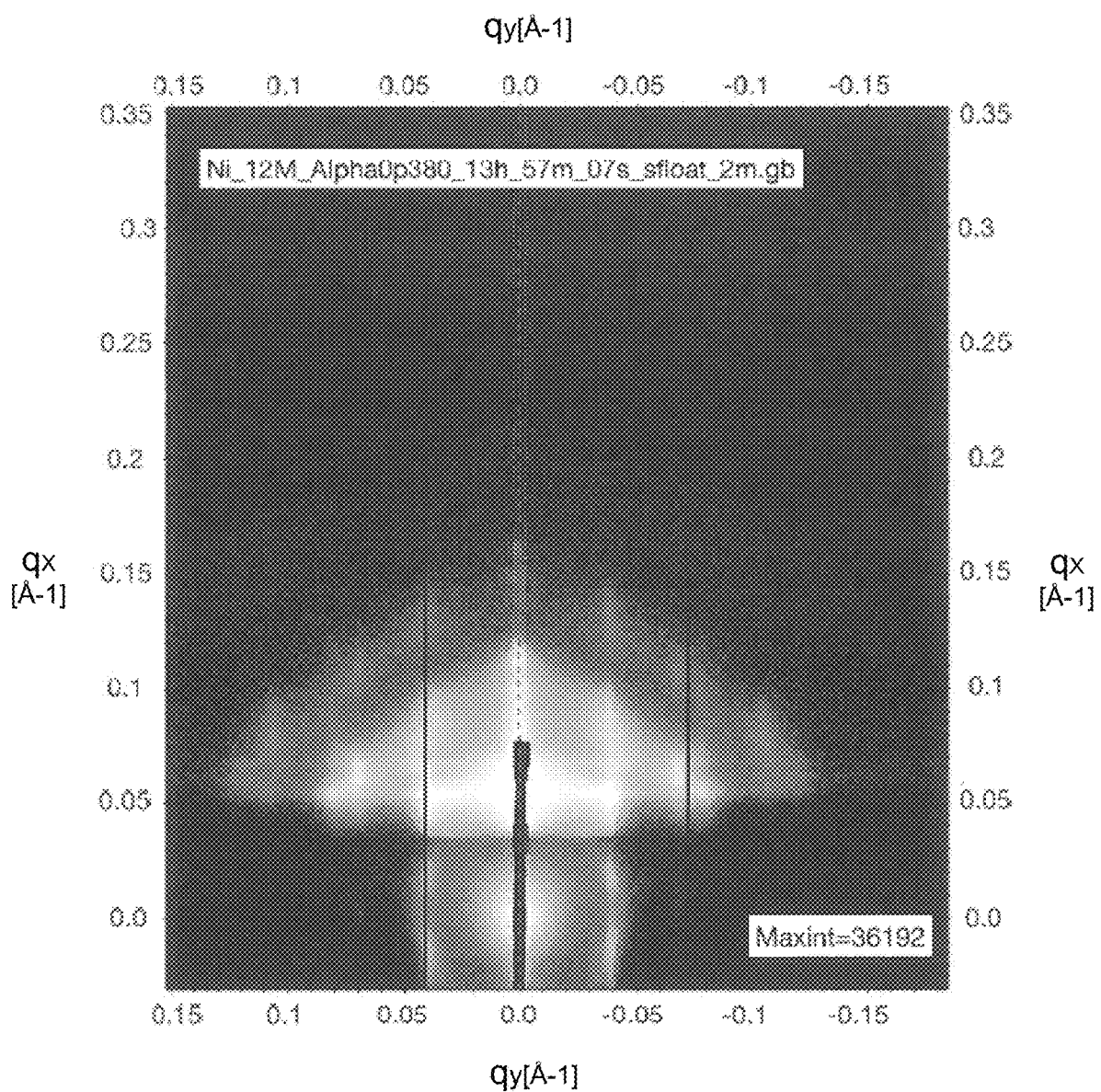
FIG. 3D is a grazing incidence xray scattering (GISAXS) map of the superlattice thin film of FIG. 3B.

Referring to FIG. 3D a grazing incidence xray scattering (GISAXS) intensity map shows the structure of the superlattice thin film 300 of FIG. 3A. The measurement averages over an area of approximately 0.8×0.5 mm. The spot pattern indicates that the nanocrystals within the nanocrystal accumulation form a well-ordered face-centered cubic packing on the electrode 214 producing ordered nanocrystal accumulation and providing a superlattice thin film 300.

Forming Isolated Supercrystal Islands

In another embodiment, nanocrystals solution is prepared by dispersing 1-dodecanethiol-capped silver nanocrystals in toluene. Applying a field of 20 V/cm for 30 minutes to this solution leads to the formation of isolated islands of nanocrystal superlattices that have a triangular shape.

Figure 4A:
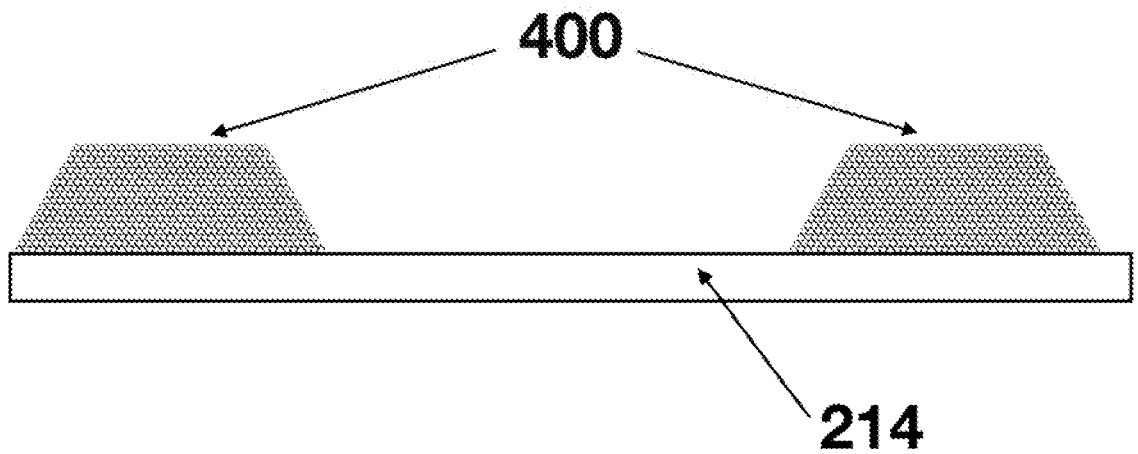
FIG. 4A shows a nanocrystal accumulation on an electrode producing ordered nanocrystal accumulation that provides isolated superlattice islands.

Referring to FIG. 4A, nanocrystals are shown forming a nanocrystal accumulation 400 on the electrode 214. The electrodes in the vessel or tank face each other. The fluid is contained in the vessel electrodes. The voltage supply produces an electrical field between electrodes. Depending on the charge of the nanocrystals contained in the fluid, the nanocrystals will migrate toward one of the electrodes and accumulate on the electrode producing the nanocrystal accumulation 400.

Figure 4B:
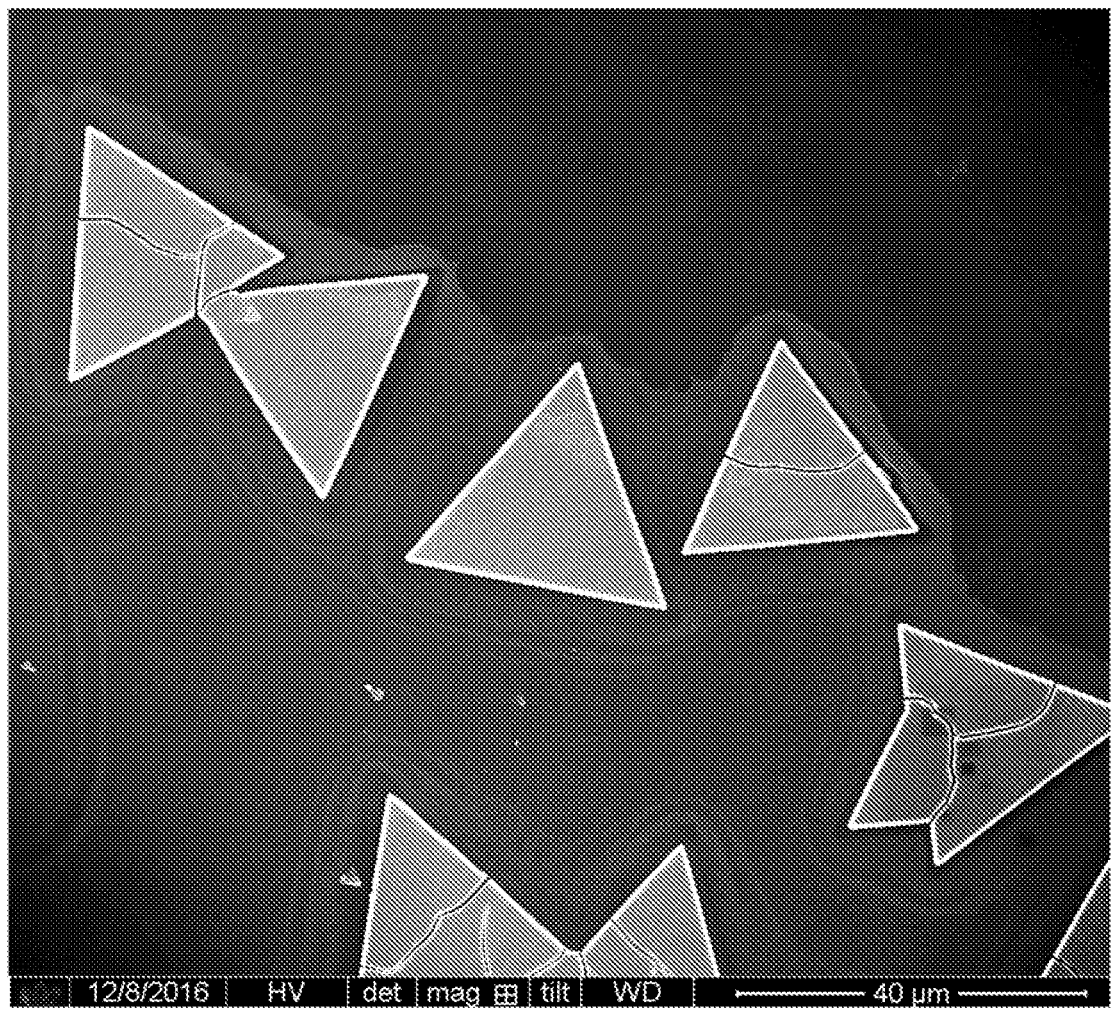
FIG. 4B is a scanning electron microscope (SEM) image of the isolated superlattice islands of FIG. 4A.

Referring to FIG. 4B a scanning electron microscope (SEM) image shows the superlattice thin film 400 of FIG. 3A in greater detail. The nanocrystals are shown forming a nanocrystal accumulation on the electrode 214 producing ordered nanocrystal accumulation and providing a superlattice thin film 400.

Figure 4C:
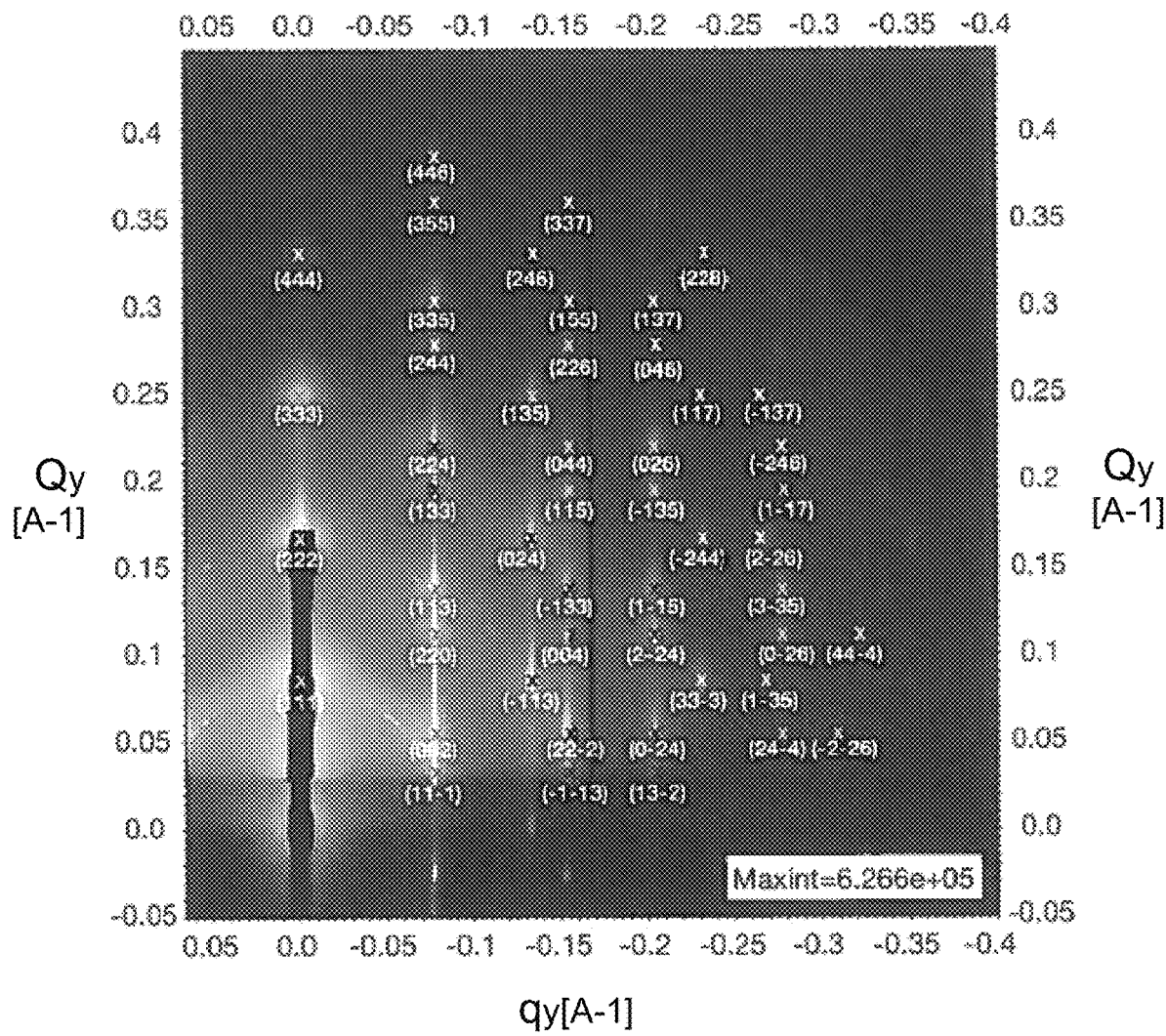
FIG. 4C is a grazing incidence xray scattering (GISAXS) map of the isolated superlattice islands of FIG. 4B.

Referring to FIG. 4C a grazing incidence xray scattering (GISAXS) intensity map shows the structure of the superlattice thin film 400 of FIG. 3A. The measurement averages over an area of approximately 0.8×0.5 mm. The spot pattern indicates that the nanocrystals within the nanocrystal accumulation form a well-ordered face-centered cubic packing on the electrode 214 producing ordered nanocrystal accumulation and providing a superlattice thin film 400.

Forming Coalesced Multigrain Films from Supercrystal Islands

In one embodiment, nanocrystals solution is prepared by dispersing 1-dodecanethiol-capped silver nanocrystals in toluene. Applying a field of 20 V/cm for 30 minutes to this solution leads to the formation of isolated islands of nanocrystal superlattices that have a triangular shape. Applying the voltage for a longer time, leads to the growth of the islands, which eventually merge and form a multigrain thick film. In one embodiment, a voltage of 5 V is applied between two electrodes that are 2.5 mm apart and toluene solution of 1-dodecanethiol-capped silver nanocrystals are used. Applying the voltage for 30 min leads to the formation of isolated islands; applying the voltage for 60 min causes islands to merge; applying the voltage for 120 min causes all the islands to merge, forming a multigrain film of nanocrystal superlattices that has a thickness in the range of 1-2 μm.

Figure 5A:
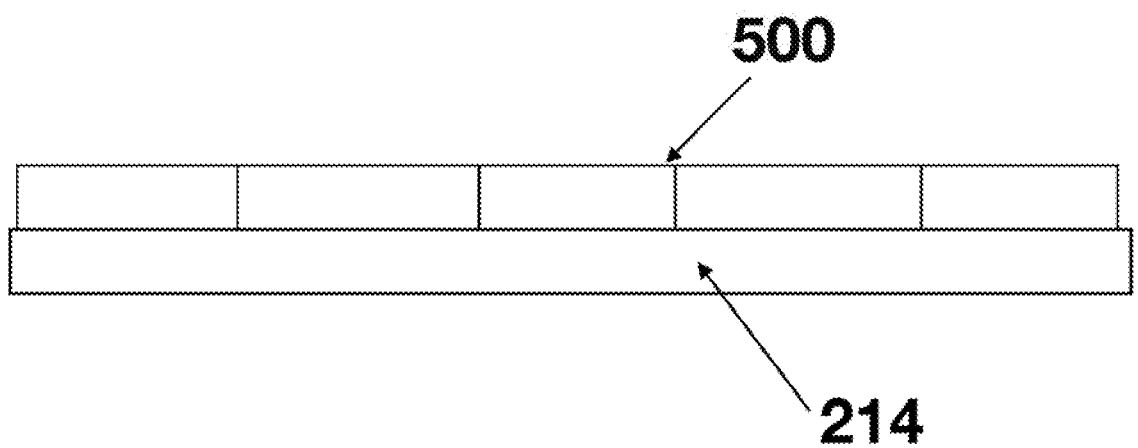
FIG. 5A shows a nanocrystal accumulation on an electrode producing ordered nanocrystal accumulation that provides coalesced superlattice islands that form a multigrain film.

Referring to FIG. 5A, nanocrystals are shown forming a nanocrystal accumulation 500 on the electrode 214. The electrodes in the vessel or tank face each other. The fluid is contained in the vessel electrodes. The voltage supply produces an electrical field between electrodes. Depending on the charge of the nanocrystals contained in the fluid, the nanocrystals will migrate toward one of the electrodes and accumulate on the electrode producing the nanocrystal accumulation 500.

Figure 5B:
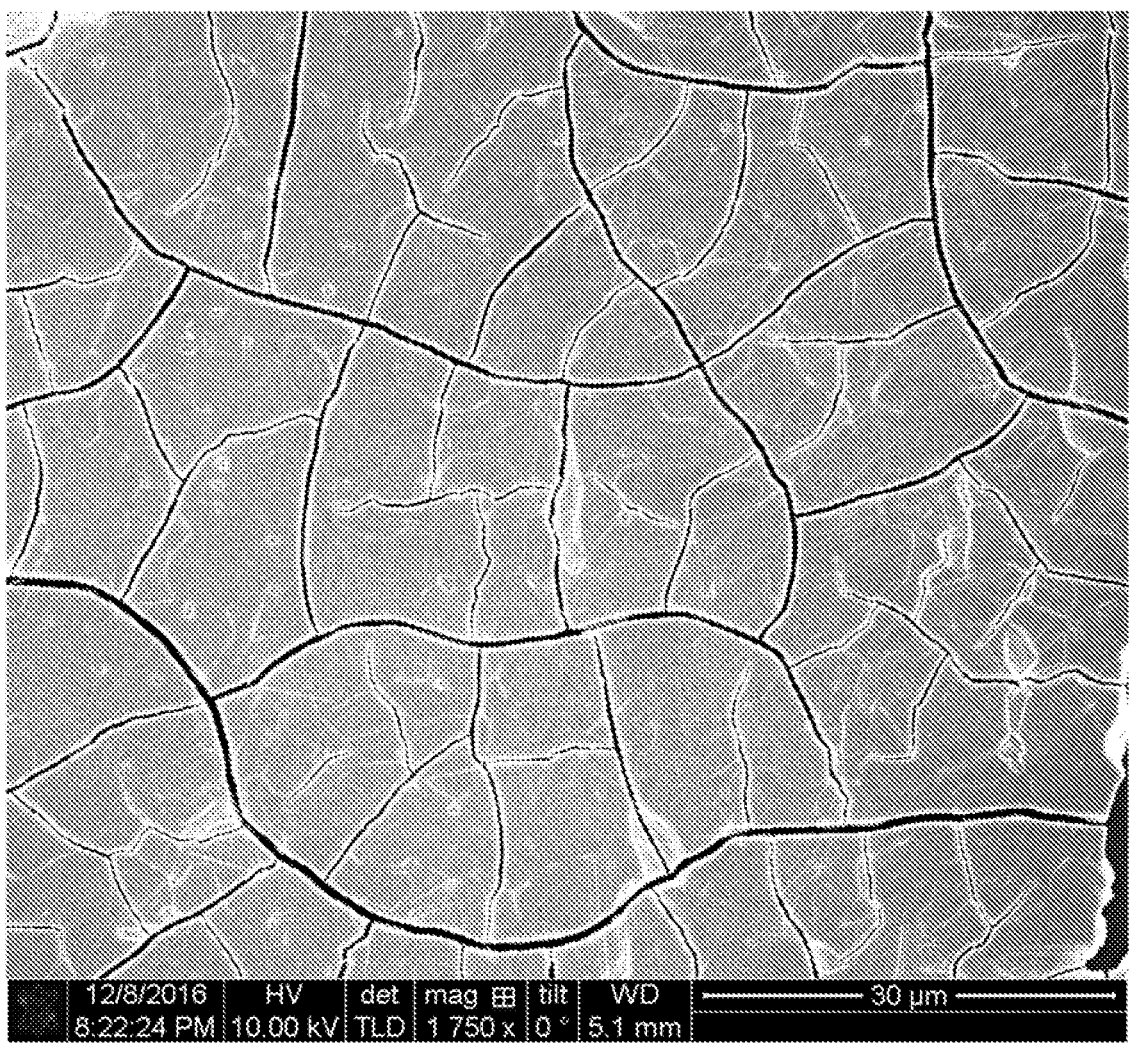
FIG. 5B is a scanning electron microscope (SEM) image of the coalesced superlattice islands that form a multigrain film of FIG. 5A.

Referring to FIG. 5B a scanning electron microscope (SEM) image shows the nanocrystal accumulation 500 on the electrode 214. The electrodes in the vessel or tank face each other. The fluid is contained in the vessel electrodes. The voltage supply produces an electrical field between electrodes. Depending on the charge of the nanocrystals contained in the fluid, the nanocrystals will migrate toward one of the electrodes and accumulate on the electrode producing the nanocrystal accumulation 500.

Figure 5C:
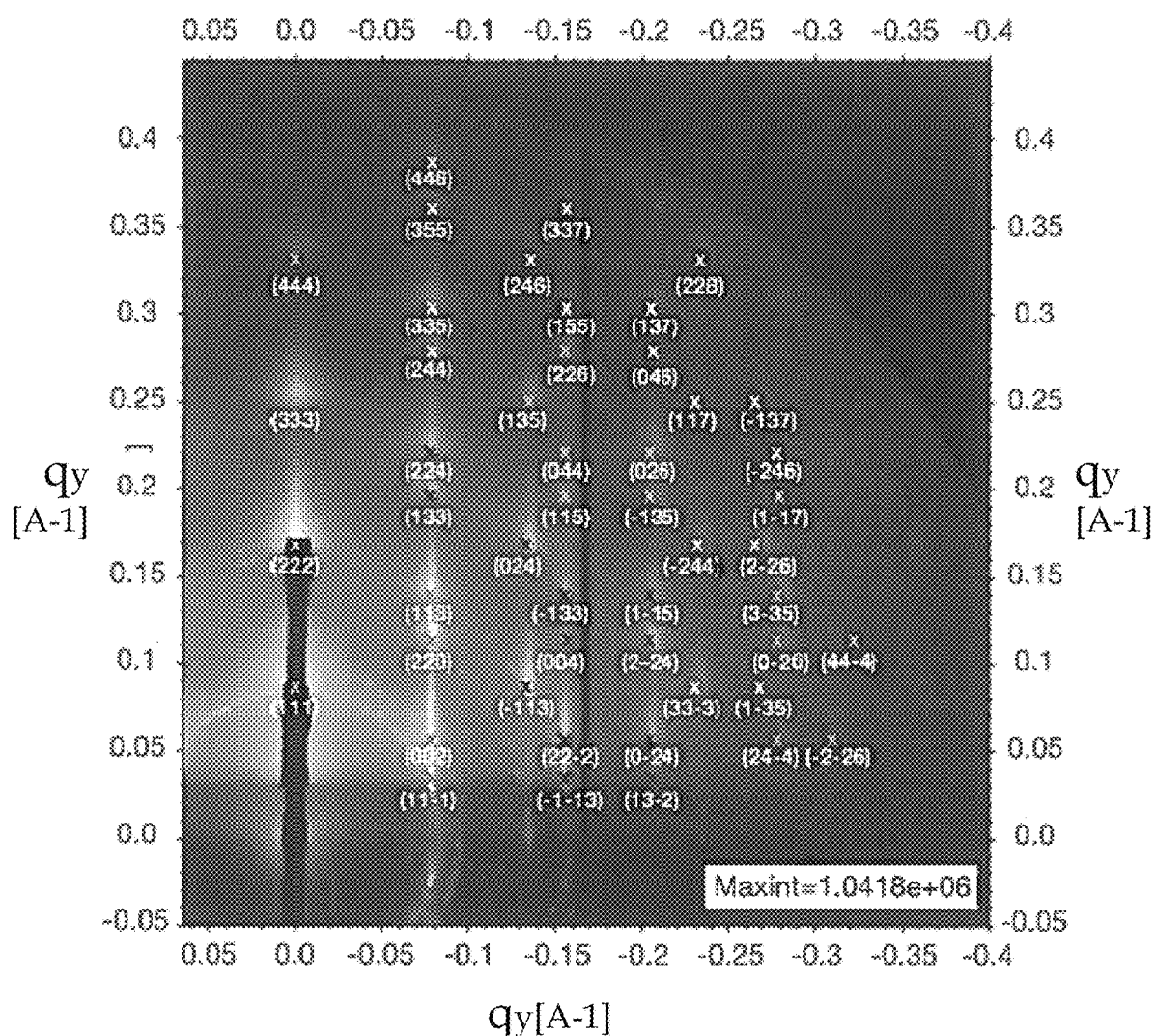
FIG. 5C is a grazing incidence xray scattering (GISAXS) map of the coalesced superlattice islands that form a multigrain film of FIG. 5B.

Referring to FIG. 5C a grazing incidence xray scattering (GISAXS) intensity map shows the structure of the superlattice thin film 500 of FIG. 5A. The measurement averages over an area of approximately 0.8×0.5 mm. The spot pattern indicates that the nanocrystals within the nanocrystal accumulation form a well-ordered face-centered cubic packing on the electrode 214 producing ordered nanocrystal accumulation and providing a superlattice thin film 500.

Controlling the Nucleation Density and Growth Rate of Superlattices

The rate of accumulation of the nanocrystals in the nanocrystal accumulation 220 can be influenced by many factors. Such factors include the distance between electrodes, the voltage, the nanocrystal charge, and the concentration of nanocrystals in the fluid. The present invention drives the motion of nanocrystals to electrodes with applied electric fields. A stronger electric field, created by applying a higher electrical voltage between the electrodes or decreasing the distance between the electrodes, drives nanocrystals to move at higher velocity. This increases the nanocrystal concentration near the electrode at a faster rate, causing the superlattices to nucleate at a higher density and grow at a faster rate. In preferred embodiments, the distance between electrodes is kept at 2.5 mm, while the voltage is increased from 5 to 50 V. The nucleation density and growth rate of nanocrystal superlattices are found to increase as applied voltage.

Controlling the Lattice Constant, and Degree of Order of Superlattices

Practically, for any nanocrystal sample, the size is not perfectly uniform, but has a distribution centered around the average size. The invented method, provides a means to tune the size and size distribution of the nanocrystals within the nanocrystal accumulation using the electric field.

Figure 6A:
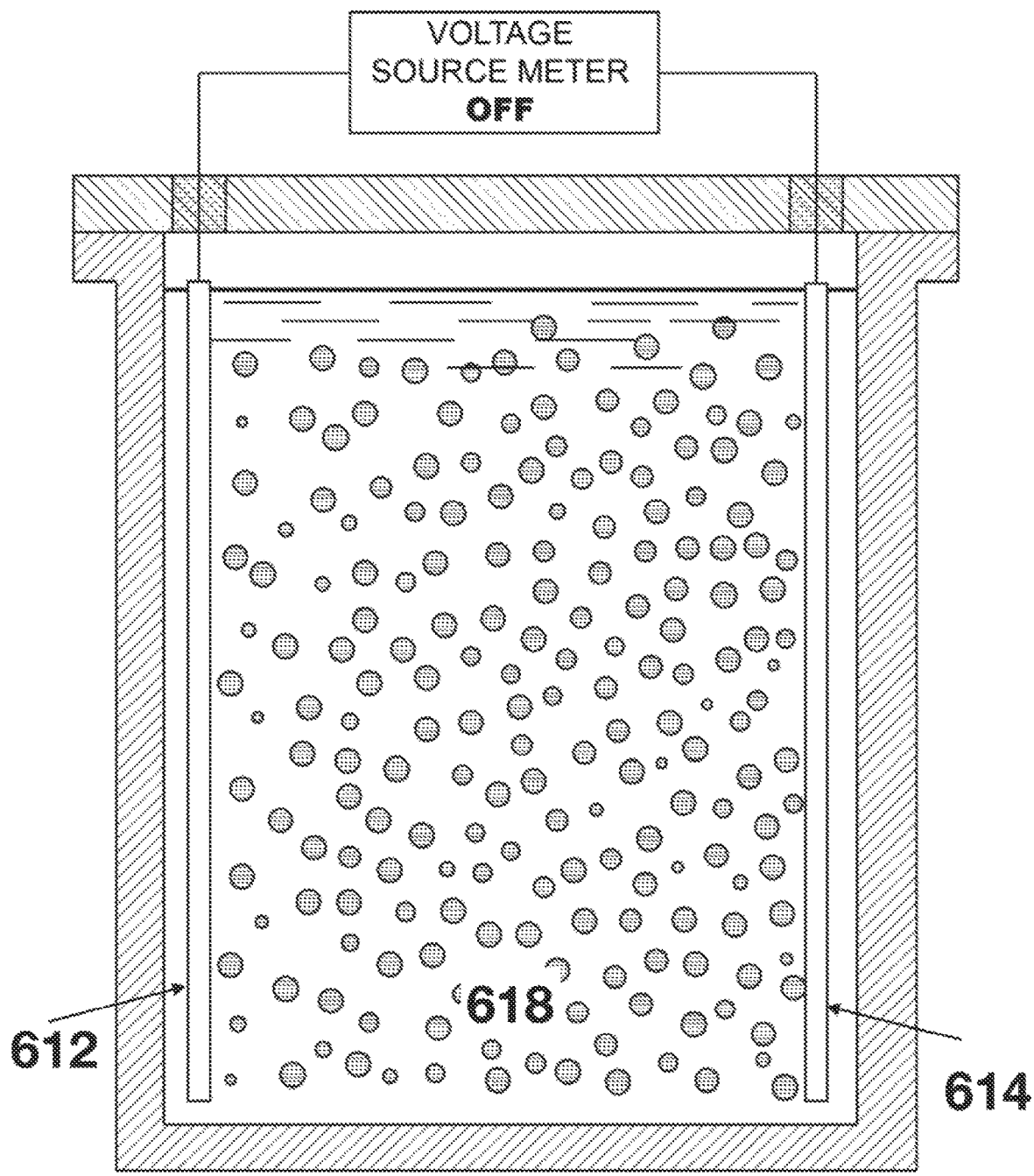
FIG. 6A illustrates an example embodiment of the inventor's apparatus with the voltage off.

Referring to FIG. 6A, the fluid with dispersed nanocrystals 618 fills the region between the electrodes 612 and 614. The nanocrystals have a range of sizes and are randomly distributed when the voltage is off.

Figure 6B:
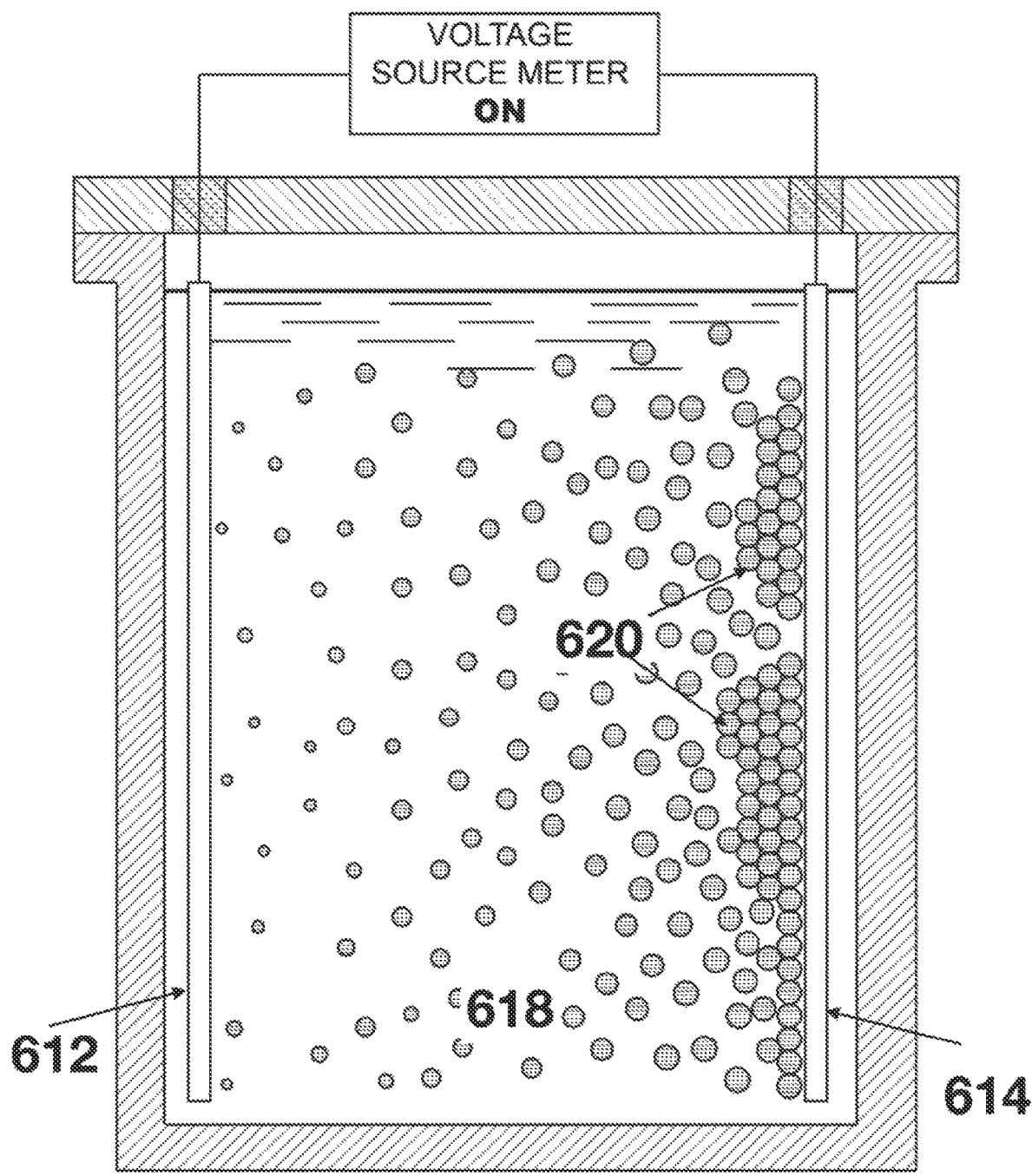

Referring to FIG. 6B, the same fluid is shown when the voltage is turned on generating an electric field between electrodes 612 and 614. Electric fields cause larger nanocrystals to move faster. This effect is more pronounced at weaker electric fields. For this reason, at low field strengths the larger nanocrystals preferentially incorporate into the nanocrystal accumulate 620.

In preferred embodiments, the distance between electrodes is kept at 2.5 mm, while the voltage is increase from 5 to 50 V. The nanocrystals assembled into the superlattices is found to be larger with lower applied voltages. This causes the nanocrystal superlattice to have larger lattice constants at lower applied voltage. The size distribution of nanocrystal assembled into the superlattices is found to be narrower with lower applied voltages. This causes the superlattices made with lower applied voltages to have higher degrees of order.

Figure 6C:
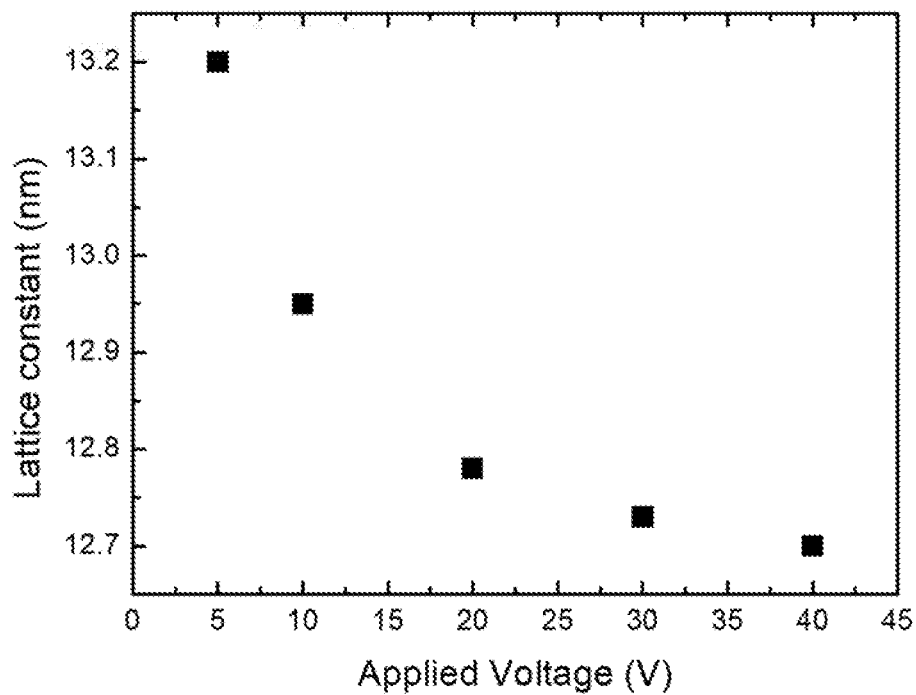
FIG. 6C is a plot of the lattice constant in nanometers as a function of applied voltage in volts.

Referring to FIG. 6C a plot of the lattice constant is plotted as a function of the applied voltage when a toluene solution of 1-dodecanethiol-capped silver nanocrystals is used. The plot shows that when a voltage of 5V is used the average nanocrystal size within the nanocrystal accumulation 200 is 9.3 nm (including ligands) and when a voltage of 40 V is used the average nanocrystal size within the nanocrystal accumulation 200 is 9 nm (including ligands).

This effect can be used to decrease size dispersity within nanocrystal solutions. In particular, the present invention can separate a nanocrystal sample with a wide size distribution into several portions, each with a narrower size distribution. In preferred embodiments, the distance between electrodes is kept at 2.5 mm, a voltage of 5 V is applied between the electrodes for 2 hours. The nanocrystal superlattice formed on the electrode is re-dispersed in the carrier fluid that is kept separately and labeled as portion #1. The previous process is repeated, and the newly collected nanocrystal solution is kept separately in another container and labelled as portion #2. The previous processes are repeated until no more superlattices can be formed with the 5V voltage. At this point, the applied voltage is increased to 10 V. With the increased voltage, the previous processes are repeated until the applied voltage need to be increase again by another interval of 5 V. The processes end when there are no more nanocrystals left in the solution. The outcome of the process describe in this paragraph is a series of portions of nanocrystal solutions that is labelled as #1, #2, #3 . . . . The nanocrystals in the portion labelled with a smaller number have a larger average size.

Forming Superlattices with a Porous Morphology

Nanocrystal superlattices created above 0° C. form films or islands without porosity, however these formed below 0° C. can have a porous morphology due to condensed water droplets. In an embodiment, a voltage of 5 V is applied between two electrode that are 2.5 mm apart for 30 min. Toluene solution of 1-dodecanethiol-capped silver nanocrystals are used. The temperature is controlled in the range of −50° C. to −10° C. using isopropyl alcohol and dry ice mixture. Once the electrodes are withdrawn from the solution, micro droplets of water are condensed on the electrode surface and become templates for pores in the nanocrystal superlattices. This leads to the formation of nanocrystal superlattice with a porous morphology.

Forming Superlattices on Patterned Substrates

The method provides a means to deposit superlattices onto substrates patterned with conductive and non-conductive regions. Superlattices are deposited on conductive regions where an electric field is also applied. Superlattices do not form on regions that are non-conductive or where a field is not applied. Patterns may be any shape including arrays or lines or elements that are part of a circuit or device or detector.

Figure 7A:
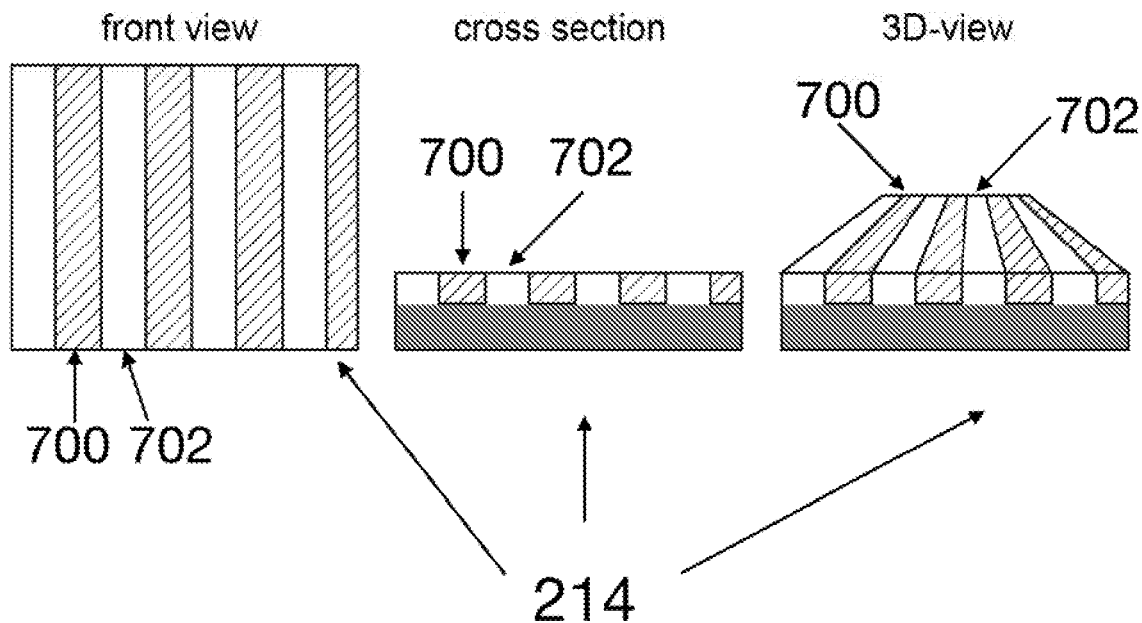
FIG. 7A is an illustration of a patterned substrate with superlattices deposited on conducting regions.

FIG. 7A illustrates a pre-patterned electrode 214 that has stripes of a non-conducting material (such as silica) on a conducting electrode (such as doped silicon). A nanoparticle accumulates 700 forms on the conducting regions and not on the non-conducting regions 702 when a voltage is applied.

Figure 7B:
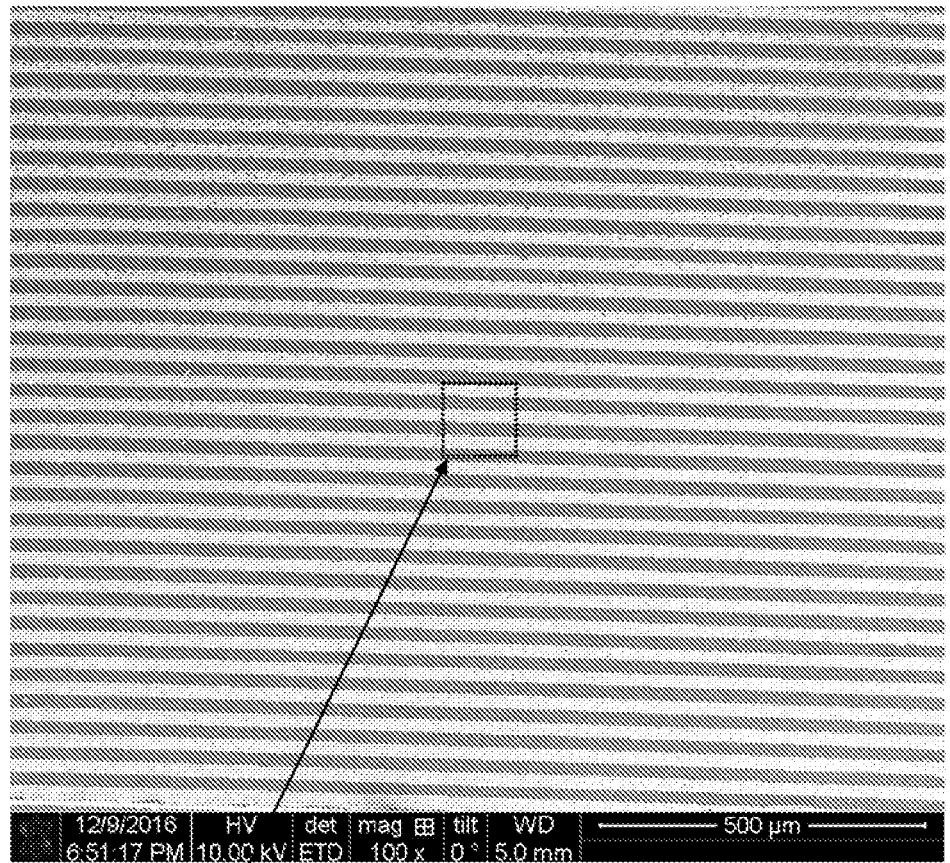
FIG. 7B is a scanning electron microscope (SEM) image of the superlattices deposited onto the patterned substrate of FIG. 7A.

Referring to FIG. 7B a scanning electron microscope (SEM) image shows the nanocrystal accumulate 700 on the electrode 214 when a toluene solution of 1-dodecanethiol-capped silver nanocrystals is used on a doped silicon substrate that is pre-patterned with silica stripes. The light regions are nanocrystal superlattices whereas the dark regions are silica.

Figure 7C:
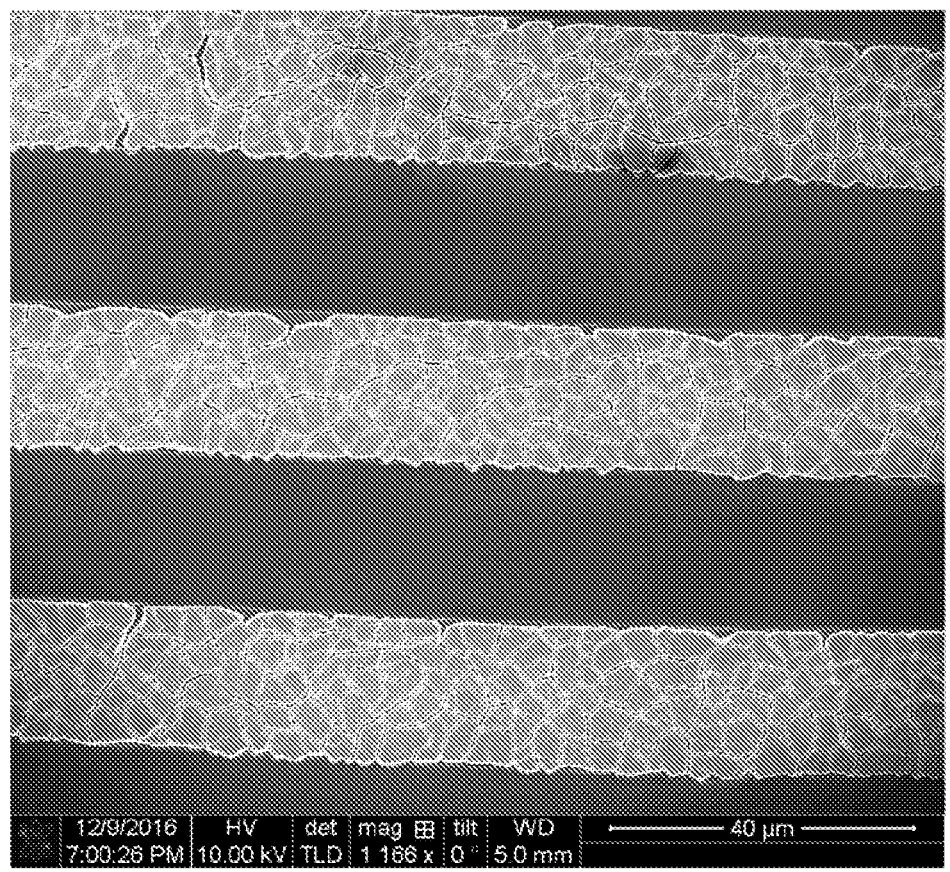
FIG. 7C is a scanning electron microscope (SEM) image of an enlarged portion of the superlattices deposited onto the patterned substrate of FIG. 7B.

Referring to FIG. 7C a scanning electron microscope (SEM) image shows an enlarged view of FIG. 7B.

In one embodiment superlattices may be deposited onto an array of conductive pads as is common in detectors or displays. Deposition conditions may be tuned as described above to deposit a thin film or to nucleate one single island (supercrystal) per array element, or many supercrystals per element. Each element in the array may be composed of the same or different nanocrystals. For example, a grid of two materials is made by applying a voltage to a portion of the grid elements in one nanocrystal solution thereby growing superlattices on a fraction of the array elements. Subsequently the substrate is placed in a second nanocrystal solution and a voltage applied to the remaining array elements, thereby growing superlattices on the remaining array elements. An optional ligand exchange step between depositions prevents the first materials from dissolving as the second materials is being deposited.

In another embodiment superlattices may be integrated within a stacked structure that is part of a device.

Superlattices May be Applied to Shaped Substrates

Using the invented method superlattices will form conformal to surfaces following electric field lines. This allows superlattices to be applied to curved or three-dimensionally shaped substrates.

Sequential Processing to Exchange Ligands

With a flow apparatus or sequential dipping or titration the invented method provides a means to change the capping ligands on the surfaces of nanoparticles at the same time that they are being assembled/deposited, leading to a systematic control of nanoparticle separations in a superlattice without the defects, e.g. cracks, associated with the volume change. This method can potentially tune the wave function overlap, spin and phonon coupling between nanoparticles, and charger carrier delocalization and miniband formation within the nanoparticle superlattices.

In an embodiment, oleic acid capped nickel nanocrystals in hexane are deposited on a silicon substrate in a thin film geometry when a voltage of 5 V is applied between two electrode that are 2.5 mm apart for 5 min. Subsequently exposing the substrate to a solution of 1 mmol acetic acid in hexane causes the acetic acid to replace the oleic acid ligands and thus to reduce the nanocrystal nearest neighbor spacing.

Flow or Sequential Processing to Create Complex Structures

With a flow apparatus or sequential dipping, the invented method provides a means to build up complex structures such as heterojunctions and multilayers.

To create a heterojunction of two materials, superlattices of the first material are deposited to the desired thickness according to steps i-vi. The substrate is then optionally exposed to solvents or ligands that will render the nanocrystals insoluble in the second solvent. Steps i-vi are then repeated in the second nanocrystal solution which will deposit the second type of superlattice. This sequence is repeated to build up multilayers.

The sequential change in solution may be performed in a flow through geometry allowing the process to be automated.

Forming Superlattices Composed of More than One Type of Nanocrystal

This example demonstrates that superlattices can be composed of more than one material. The process described in example 1 is repeated with two types of nanocrystals of the same sign of charge in the solution. One nanoparticle is half the size of the other. This composition is expected to form binary superlattices.

Example 2. Formation of Isolated Supercrystals

This example demonstrates that highly ordered faceted supercrystals crystals can be deposited onto substrates. 7.1±1.1 nm diameter 1-dodecanethiol-capped silver (Ag) nanocrystals are dispersed in toluene at a concentration of 4 mg/mL. The nanocrystal solution is stored in a 5 mL Teflon beaker. The electrodes are 25 mm (L)×12 mm (W)×0.5 mm (T) double side polished, p-type doped silicon wafer that is coated with gold on one side to enhance electrical connection. Two parallel electrodes are partially immersed in the nanocrystal solution with uncoated silicon side facing each other at a distance of 2.5 mm. A voltage of 5 V is applied between the electrodes with a commercially available source meter, generating an electric field with a strength of 20 V/cm. The electric field is applied for 30 min and the electrodes are carefully pulled out of the nanocrystal solution, dried in air for 10 seconds, and the electric field is turned off. This process deposits ordered superlattices of Ag nanocrystals on the anode. The superlattices have a triangular island morphology, as shown in FIG. 2.

The preparation of a wide variety of nanocrystals are known to those skilled in the art. The Ag nanocrystals used in this experiment were synthesized by reducing $Ag^+$ ions with sodium borohydride in two phase (organic and aqueous) mixture. 190 mg of silver nitrate dissolved in 30 mL of deionized water and 2.23 g of tetraoctylammonium bromide dissolved in 2.3 mL of chloroform are mixed and stirred for 45 min. The organic phase is extracted and mixed with 300 µL of 1-dodecanthiol. The solution is stirred for another 7 min before adding 30 mL of 4° C. sodium borohydride (390 mg) aqueous solution. The two-phase mixture is stirred for 2.5 hours before the organic phase is extracted. The organic phase containing 1-dodecanethiol-capped Ag nanocrystals is extracted and centrifuged at 8000 rpm for 5 min to precipitate poorly capped nanocrystals and/or their aggregates. The supernatant is mixed with equal-weight ethanol and centrifuged again at 8000 rpm. The precipitate, consisting of cleaned nanocrystals, is finally re-dispersed in toluene.

Example 3. Formation of Conformal Thin Films

This example demonstrates that ordered thin film geometries can be deposited onto substrates. 15.5±1.3 nm diameter oleic acid-capped nickel (Ni) nanocrystals are dispersed in hexane at a concentration of 5 mg/mL. The nanocrystal solution is stored in a 5 mL Teflon beaker. The electrodes are 25 mm (L)×12 mm (W)×0.5 mm (T) double side polished, p-type doped silicon wafer that is coated with gold on one side to enhance electrical connection. Two parallel electrodes are partially immersed in the nanocrystal solution with uncoated silicon side facing each other at a distance of 3.5 mm. A voltage of 2 V is applied between the electrodes with a commercially available source meter, generating an electric field with a strength of 5.7 V/cm. The electric field is applied for 5 min and the electrodes are carefully pulled out of the nanocrystal solution, dried in air for 5 seconds, and the electric field is turned off. This process deposits ordered superlattices of Ni nanocrystals on both electrodes with more deposition on the cathode and less on the anode. The superlattices have a thin film morphology that is ~10 nanocrystals thick, as shown in FIG. 3.

The preparation of a wide variety of nanocrystals are known to those skilled in the art. The Ni nanocrystals used in this experiment were synthesized by reducing $Ni^{2+}$ ions with trioctylphosphine (TOP) in oleylamine at an elevated temperature in an inert atmosphere. 1.28 gram of nickel(II) acetylacetonate is dissolved in 26.65 gram of technical grade oleylamine that has been degassed under the vacuum of a Schlenk line at 80° C. for 30 min. The mixture is further degassed for another 10 min before vacuum is removed, nitrogen gas is introduced, and 4.5 mL of TOP is injected to the reaction flask. The temperature is then rapidly increased to 220° C. and maintained for two hours. Magnetic stirring is applied during both degassing and reaction. At the end of reaction, heating is removed, and the reaction flask is dipped into water/ice mixture as soon as the temperature drops to 200° C. The solution in the reaction flask is cooled to room temperature and transferred to centrifuge tubes. 40 mL of acetone is added to the centrifuge tubes that are centrifuged at 8000 rpm for 10 min to precipitate Ni nanocrystals. The supernatant is discarded, and the precipitate is collected with 5 mL of hexane. 300 µL of oleic acid is added to the nanocrystal solution before it is mixed with 30 mL of acetone and centrifuged again at 8000 rpm for 5 min. The precipitate, containing Ni nanocrystals, is finally re-dispersed with hexane.

Figure 8:
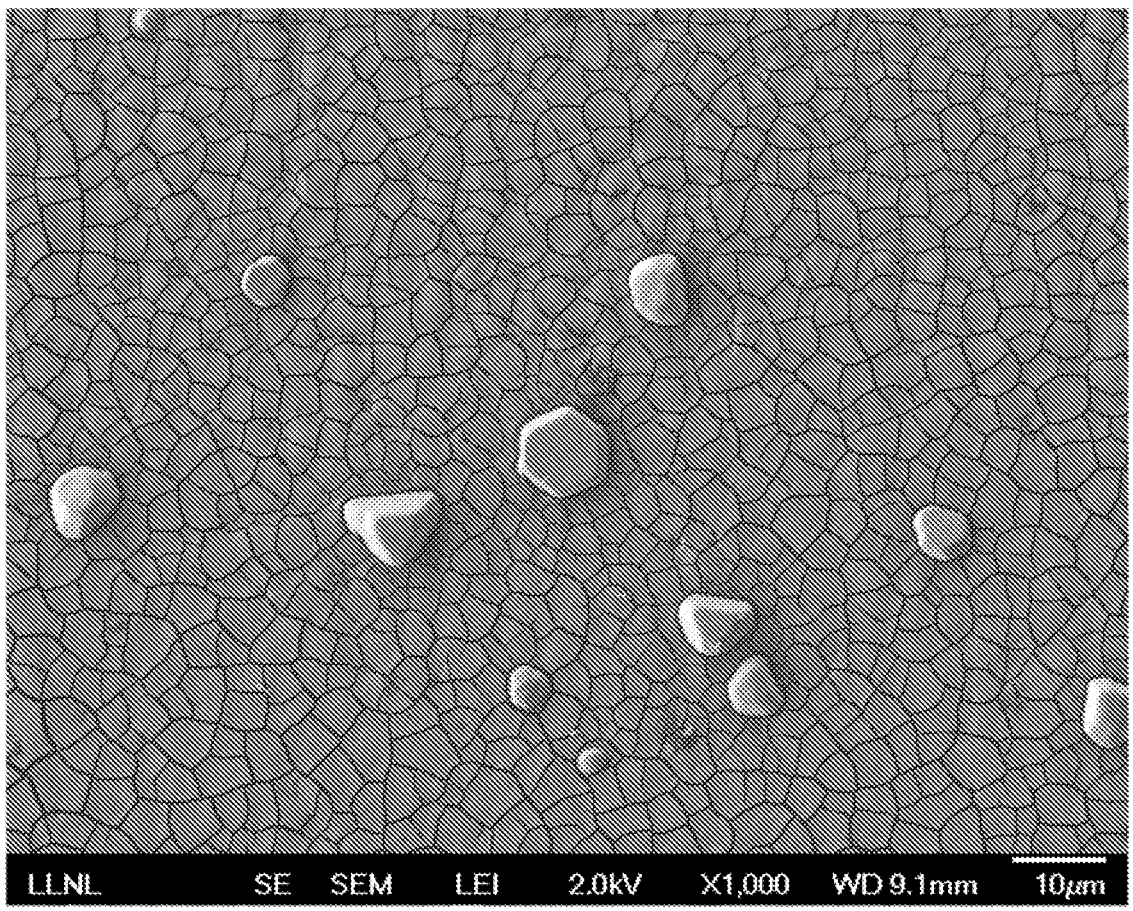
FIG. 8 is a scanning electron microscope (SEM) image of the superlattice islands after changing ligands.

Example 4. Changing Morphology from Thin Film to Supercrystal by Altering Ligand This example demonstrates that the film morphology can be changed from a thin film geometry (Example 2, FIG. 3) to supercrystal islands by altering the ligand on the nanocrystal. 13 nm diameter napthoic acid-capped nickel (Ni) nanocrystals are dispersed in chloroform at a concentration of 5 mg/mL. The nanocrystal solution is stored in a 5 mL Teflon beaker. The electrodes are 25 mm (L)×12 mm (W)×0.5 mm (T) double side polished, p-type doped silicon wafer that is coated with gold on one side to enhance electrical connection. Two parallel electrodes are partially immersed in the nanocrystal solution with uncoated silicon side facing each other at a distance of 3.5 mm. A voltage of 1 V is applied between the electrodes with a commercially available source meter, generating an electric field with a strength of 2.86 V/cm. The electric field is applied for 60 min and the electrodes are carefully pulled out of the nanocrystal solution, dried in air for 5 seconds, and the electric field is turned off. This process deposits ordered superlattices on the negative electrode. The superlattices have a hexagonal and triangular island morphology, as shown in the scanning electron microscopy image in FIG. 8.

The preparation of a wide variety of nanocrystals are known to those skilled in the art. The Ni nanocrystals used in this experiment were synthesized by reducing $Ni^{2+}$ ions with trioctylphosphine (TOP) in oleylamine at an elevated temperature in an inert atmosphere. 1.28 gram of nickel(II) acetylacetonate is dissolved in 26.65 gram of technical grade oleylamine that has been degassed under the vacuum of a Schlenk line at 80° C. for 30 min. The mixture is further degassed for another 10 min before vacuum is removed, nitrogen gas is introduced, and 4.5 mL of TOP is injected to the reaction flask. The temperature is then rapidly increased to 220° C. and maintained for two hours. Magnetic stirring is applied during both degassing and reaction. At the end of reaction, heating is removed, and the reaction flask is dipped into water/ice mixture as soon as the temperature drops to 200° C. The solution in the reaction flask is cooled to room temperature and transferred to centrifuge tubes. 40 mL of acetone is added to the centrifuge tubes that are centrifuged at 8000 rpm for 10 min to precipitate Ni nanocrystals. The supernatant is discarded, and the precipitate is collected with 5 mL of chloroform. 200 mg of napthoic acid is added to the nanocrystal solution before it is mixed with 30 mL of acetone and centrifuged again at 8000 rpm for 5 min. The precipitate, containing Ni nanocrystals, is finally re-dispersed with chloroform.

Example 5. Depositing Superlattice Films for Use as a Solar Cell

A glass substrate is thermally evaporated with a 30-nm thick layer of aluminum, and then used as electrodes. The process described in example 1 is performed by using lead sulfide (PbS) nanocrystals, leading to the deposition of a 1 µm thick PbS nanocrystal superlattice film on the aluminum layer. The substrate is then expose to a methylammonium iodide dimethylformamide solution at a concentration of 80 mg/mL for 5 min. The treated substrate is rinsed with toluene and used as electrode again for another repetition of the process described in example 1. The substrate is then exposed to air for 5 hours and a patterned 20 nm thick Au layer is thermally evaporated on the substrate, completing the solar cell fabrication.

Example 6. Formation of Superlattices on Patterned Substrates

This example demonstrates that superlattices can be patterned. The process described in example 2 is repeated with a pre-patterned electrode. In order to create a pre-patterned electrode, parallel silicon dioxide strips that are 250 nm thick, 20 µm wide, and 20 µm apart are sputtered on the same silicon wafer used in example 2. Ag nanocrystals assembly into superlattices on the electrode surface that is not covered with silicon oxide. This process leads to the formation of parallel strips of ordered nanocrystal superlattices as shown in FIG. 7.

Example 7. Methods of Size-Selection

This example demonstrates that the size of the deposited nanocrystals can be selected by depositing with different applied potentials. The process described in example 1 is repeated and the nanocrystal superlattices deposited on the anode are re-dispersed with toluene. The process described in example 2 is repeated with a voltage of 10 V, instead of 5 V, and the superlattices are re-dispersed with toluene. The process described in example 2 is repeated with a voltage of 20 V, instead of 5 V, and the superlattices are re-dispersed with toluene. The process described in example 1 is repeated with a voltage of 30 V, instead of 5 V, and the superlattices are re-dispersed with toluene. The process described in example 1 is repeated with a voltage of 40 V, instead of 5 V, and the superlattices are re-dispersed with toluene. The process described in example 1 is repeated with a voltage of 50 V, instead of 5 V, and the superlattices are re-dispersed with toluene. The average size of nanocrystals collected at various repetition is different.

Example 8. Healing Cracks within Films Using Sequential Deposition

This example demonstrates that cracks may be healed by sequential deposition of the same material. The process described in example 2 is repeated and the anode is treated by immersing in ethanedithiol for 5 min. Ethane dithiol replaces some of the ligands on the nanocrystal surface making them less soluble in toluene or hexane and hence prevents them from redissolving in these solvents. The process described in example 1 is repeated with the treated anode. This process heals the cracks of superlattice films.

Example 9. Creating Heterojunctions Using Sequential Deposition

This example demonstrates that heterojunctions may be created using sequential depositions of different materials. The process described in example 2 is repeated and the anode is treated by immersing in ethanedithiol for 5 min. The process described in example 2 is repeated with the treated anode. This process creates heterojunctions of different nanocrystal superlattices.

Example 10. Methods to Introduce Porosity into the Superlattice Film

This example demonstrates a method to introduce porosity into the superlattice film. The process described in example 2 is repeated and the Teflon beaker in which the electric field driven assembly occurs is kept under a temperature of −50° C. created in an acetone/dry ice mixture.

Example 11. Forming Superlattices with Body Centered Tetragonal Packing

This example demonstrates that the superlattice structure may be changed by altering the hydrophobicity of the substrate. The process described in example 2 is repeated with an electrode that has been treated with oxygen plasmon. This leads to a more hydrophilic substrate that leads to a body centered tetragonal packing of the nanocrystals.

Example 12. Forming Superlattices with Face Centered Cubic Packing

This example demonstrates that the superlattice structure may be changed by altering the hydrophobicity of the substrate. The process described in example 2 is repeated with an electrode that has been treated with hydrofluoric acid etching or with an electrode that has been coated with hexamethyldisilazane. This leads to a more hydrophobic substrate that leads to a face centered cubic packing of the nanocrystals.

Example 13. Forming Superlattices on Optically Transparent Media

This example demonstrates that superlattices can be deposited on light transparent layers. The process described in example 2 is repeated with a metalized glass electrode. This provides an alternate conducting substrate that is partially transparent to light.

Example 14. Forming Superlattices on Flexible, Optically Transparent Media

This example demonstrates that superlattices can be deposited on flexible, light transparent layers. The process described in example 2 is repeated with ITO coated PET electrode. This provides an alternate flexible, conducting substrate that is partially transparent to light.

Example 15. Depositing Superlattice Films for Multispectral Electro-Emissive Displays This example demonstrates that two types of nanocrystals can be deposited onto different array elements to create an emissive display that emits different colors of light at different pixel locations. This example creates pixelated quantum dot layers and pixelated electron transfer layers. The glass, hole injection layers and hole transport layers are planar and common to all pixels.

Create a pixelated electronically addressable array using methods known to those skilled in the art. Create a one-dimensional, addressable array of 20-micron square metallic aluminum pads that have a 40-micron pitch. The array pads must exposed and the rest of the substrate including the leads to the pads, covered with a non-conductive coating such as silica or photoresist. The aluminum pads will be the cathode. Sputter deposit 15 nm of zinc oxide onto the half of the square pads using a shadow mask. Sputter deposit 15 nm of titanium dioxide onto the remaining square pads using a shadow mask.

Depositing the quantum dots using methods detailed in this patent. Apply a10 V potential to the pads coated with zinc oxide and use the method described in example 1 to deposit red quantum dots (emission at 650 nm) dispersed in toluene. The substrate is treated by immersing in ethanedithiol for 5 min. Ethane dithiol replaces some of the ligands on the nanocrystal surface making them less soluble in toluene or hexane and hence prevents them from re-dissolving in these solvents. Apply a 10 V potential to the pads coated with titanium dioxide and use the method described in example 1 to deposit green quantum dots (emission at 550 nm) dispersed in toluene. Commercial sources of red and green quantum dots are Nanoco, Nanosys, Samsung, and MKnano.

Create the anode stack using methods known to those skilled in the art. To create the anode stack, use a commercial source of 150 nm thick indium tin oxide coated glass (15-25 ohms per square) spin coat a 40-nm layer of poly(3,4-ethylenedioxythiophene)polystyrenesulfonate (PEDOT:PSS) onto the clean ITO layer. Anneal at 210 C for 10 minutes. Spin coat a 30-nm layer of poly[(9,9-dioctylfluorenyl-2,7-diyl)-co-(4,40-(N-(4-s-butylphenyl)) diphenylamine)] (TFB) dispersed in m-xylene onto the PEDOT: PSS film. Anneal at 180 C for 30 minutes.

Apply the anode stack to the patterned silicon substrate with the quantum dot grid oriented such that the quantum dot layer contacts the TFB layer.

Although the description above contains many details and specifics, these should not be construed as limiting the scope of the application but as merely providing illustrations of some of the presently preferred embodiments of the apparatus, systems, and methods. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present application fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present apparatus, systems, and methods, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

While the apparatus, systems, and methods may be susceptible to various modifications and alternative forms, specific embodiments have been shown by way of example in the drawings and have been described in detail herein. However, it should be understood that the application is not intended to be limited to the particular forms disclosed. Rather, the application is to cover all modifications, equivalents, and alternatives falling within the spirit and scope of the application as defined by the following appended claims.

All elements, parts and steps described herein are preferably included. It is to be understood that any of these elements, parts and steps may be replaced by other elements, parts and steps or deleted altogether as will be obvious to those skilled in the art.

Broadly, this writing discloses at least the following: An electric field drives nanocrystals dispersed in solvents to assemble into ordered three-dimensional superlattices. A first electrode and a second electrode 214 are in the vessel. The electrodes face each other. A fluid containing charged nanocrystals fills the vessel between the electrodes. The electrodes are connected to a voltage supply which produces an electrical field between the electrodes. The nanocrystals will migrate toward one of the electrodes and accumulate on the electrode producing ordered nanocrystal accumulation that will provide a superlattice thin film, isolated superlattice islands, or coalesced superlattice islands.

Concepts:

This writing also presents at least the following concepts.

Concept 1. A method of making nanocrystal superlattices, comprising the steps of:

providing a reactor vessel, providing a first electrode in said vessel, providing a second electrode in said vessel, providing charged nanocrystals dispersed in a solvent in said vessel between said first electrode and said second electrode, and applying a voltage across said first electrode and said second electrode producing an electrical field between said first electrode and said second electrode causing said nanocrystals to migrate to said first electrode and accumulate on said first electrode producing the nanocrystal superlattice.

Concept 2. The method of making nanocrystal superlattices of concept 1 wherein said first electrode and said second electrode face each other.

Concept 3. The method of making nanocrystal superlattices of concepts 1 and 2 wherein said nanocrystals are statically or intermittently charged.

Concept 4. The method of making nanocrystal superlattices of concepts 1, 2, and 3 wherein said step of applying a voltage across said first electrode and said second electrode comprises of applying a voltage across said first electrode and said second electrode with a choice of field strength, temperature, and time.

Concept 5. The method of making nanocrystal superlattices of concepts 1, 2, 3, and 4 further comprising a post-processing step of heating to remove nanocrystal surface functionalization.

Concept 6. The method of making nanocrystal superlattices of concepts 1, 2, 3, 4, and 5 further comprising a post-processing step of sintering.

Concept 7. The method of making a nanocrystal superlattice of concepts 1, 2, 3, 4, 5, and 6 wherein said first electrode and said second electrode are made of the same material.

Concept 8. The method of making a nanocrystal superlattice of concepts 1, 2, 3, 4, 5, 6, and 7 wherein said first electrode and said second electrode are made of different materials.

Concept 9. The method of making a nanocrystal superlattice of concepts 1, 2, 3, 4, 5, 6, 7, and 8 wherein said nanocrystals dispersed in a solvent are 1-dodecanethiol-capped silver nanocrystals dispersed in toluene.

Concept 10. The method of making a nanocrystal superlattice of concepts 1, 2, 3, 4, 5, 6, 7, 8, and 9 wherein said nanocrystals dispersed in a solvent are oleic acid-capped nickel nanocrystals in hexane.

Concept 11. The method of making a nanocrystal superlattice of concepts 1, 2, 3, 4, 5, 6, 7, 8, 9, and 10 wherein said nanocrystals dispersed in a solvent are napthoic-capped nickel nanocrystals in chloroform.

Concept 12. The method of making a nanocrystal superlattice of concepts 1, 2, 3, 4, 5, 6, 7, 8, 9, 10, and 11 wherein said electrical field between said first electrode and said second electrode causing said nanocrystals to migrate to said first electrode and accumulate on said first electrode produces conformal films nanocrystal superlattices.

Concept 13. The method of making a nanocrystal superlattice of concepts 1, 2, 3, 4, 5, 6, 7, 8, 9, 10, 11, and 12 wherein said electrical field between said first electrode and said second electrode causing said nanocrystals to migrate to said first electrode and accumulate on said first electrode produces islands of nanocrystal superlattices.

Concept 14. The method of making a nanocrystal superlattice of concepts 1, 2, 3, 4, 5, 6, 7, 8, 9, 10, 11, 12, and 13 wherein said islands merge and form a multigrain thick nanocrystal superlattice film.

Concept 15. The method of making a nanocrystal superlattice of concepts 1, 2, 3, 4, 5, 6, 7, 8, 9, 10, 11, 12, 13, and 14 wherein said step of providing a first electrode in said vessel comprises providing a first electrode patterned with conductive and non-conductive regions and wherein said step of applying a voltage across said first electrode and said second electrode producing an electrical field between said first electrode and said second electrode causes said nanocrystals to migrate to said first electrode and accumulate on said conductive regions of said first electrode.

Concept 16. The method of making a nanocrystal superlattice of concepts 1, 2, 3, 4, 5, 6, 7, 8, 9, 10, 11, 12, 13, 14, and 15 wherein said step of providing a first electrode in said vessel comprises providing a first electrode with conductive pads and non-conductive regions and wherein said step of applying a voltage across said first electrode and said second electrode producing an electrical field between said first electrode and said second electrode causes said nanocrystals to migrate to said first electrode and accumulate on said conductive pads of said first electrode.

Concept 17. A method to separate a nanocrystal solution sample into separate portions, comprising the steps of:
providing a reactor vessel,
providing a first electrode in said vessel,
providing a second electrode in said vessel,
providing charged nanocrystals dispersed in a solvent in said vessel between said first electrode and said second electrode,
applying a voltage across said first electrode and said second electrode producing an electrical field between said first electrode and said second electrode causing said nanocrystals to migrate to said first electrode and producing a nanocrystal accumulate on said first electrode
removing said first electrode with said nanocrystal accumulate from the solution with the voltage on, and
redispersing said nanocrystal accumulate on said first electrode by dipping said nanocrystal accumulate on said first electrode into a carrier fluid to create a separate portion.

Concept 18. The method to separate a nanocrystal solution sample into separate portions of concept 17,
wherein said electrical field is the smallest feasible electric field, and
wherein said smallest feasible electric field is used to create portions with larger average nanocrystal sizes and wherein the process is repeating with said smallest feasible electric field and then with increased electric fields to create additional portions each with smaller average nanocrystal size.

Concept 19. An apparatus for making a thin film or a superlattice, comprising:
means for driving nanocrystals dispersed in solvents to assemble into an ordered three-dimensional nanocrystal thin film or an ordered three-dimensional nanocrystal superlattice.

The invention claimed is:
1. A method of making nanocrystal superlattices, comprising the steps of:
providing a reactor vessel,
providing a first electrode in said vessel,
providing a second electrode in said vessel,
providing charged nanocrystals dispersed in a solvent in said vessel between said first electrode and said second electrode, and
applying a voltage across said first electrode and said second electrode producing an electrical field between said first electrode and said second electrode causing said nanocrystals to migrate to said first electrode and accumulate on said first electrode producing the nanocrystal superlattice.

2. The method of making nanocrystal superlattices of claim 1 wherein said first electrode and said second electrode face each other.

3. The method of making nanocrystal superlattices of claim 1 wherein said nanocrystals are statically or intermittently charged.

4. The method of making nanocrystal superlattices of claim 1 wherein said step of applying a voltage across said first electrode and said second electrode comprises of applying a voltage across said first electrode and said second electrode with a choice of field strength, temperature, and time.

5. The method of making nanocrystal superlattices of claim 1 further comprising a post-processing step of heating to remove nanocrystal surface functionalization.

6. The method of making nanocrystal superlattices of claim 1 further comprising a post-processing step of sintering.

7. The method of making a nanocrystal superlattice of claim 1 wherein said first electrode and said second electrode are made of the same material.

8. The method of making a nanocrystal superlattice of claim 1 wherein said first electrode and said second electrode are made of different materials.

9. The method of making a nanocrystal superlattice of claim 1 wherein said nanocrystals dispersed in a solvent are 1-dodecanethiol-capped silver nanocrystals dispersed in toluene.

10. The method of making a nanocrystal superlattice of claim 1 wherein said nanocrystals dispersed in a solvent are oleic acid-capped nickel nanocrystals in hexane.

11. The method of making a nanocrystal superlattice of claim 1 wherein said nanocrystals dispersed in a solvent are napthoic-capped nickel nanocrystals in chloroform.

12. The method of making a nanocrystal superlattice of claim 1 wherein said electrical field between said first electrode and said second electrode causing said nanocrystals to migrate to said first electrode and accumulate on said first electrode produces conformal films nanocrystal superlattices.

13. The method of making a nanocrystal superlattice of claim 1 wherein said electrical field between said first electrode and said second electrode causing said nanocrystals to migrate to said first electrode and accumulate on said first electrode produces islands of nanocrystal superlattices.

14. The method of making a nanocrystal superlattice of claim 13 wherein said islands merge and form a multigrain thick nanocrystal superlattice film.

15. The method of making a nanocrystal superlattice of claim 1 wherein said step of providing a first electrode in said vessel comprises providing a first electrode patterned with conductive and non-conductive regions and wherein said step of applying a voltage across said first electrode and said second electrode producing an electrical field between said first electrode and said second electrode causes said nanocrystals to migrate to said first electrode and accumulate on said conductive regions of said first electrode.

16. The method of making a nanocrystal superlattice of claim 1 wherein said step of providing a first electrode in said vessel comprises providing a first electrode with conductive pads and non-conductive regions and wherein said step of applying a voltage across said first electrode and said second electrode producing an electrical field between said first electrode and said second electrode causes said nanocrystals to migrate to said first electrode and accumulate on said conductive pads of said first electrode.

17. A method to separate a nanocrystal solution sample into separate portions, comprising the steps of:
providing a reactor vessel,
providing a first electrode in said vessel,
providing a second electrode in said vessel,
providing charged nanocrystals dispersed in a solvent in said vessel between said first electrode and said second electrode,
applying a voltage across said first electrode and said second electrode producing an electrical field between said first electrode and said second electrode causing said nanocrystals to migrate to said first electrode and producing a nanocrystal accumulate on said first electrode
removing said first electrode with said nanocrystal accumulate from the solution with the voltage on, and
redispersing said nanocrystal accumulate on said first electrode by dipping said nanocrystal accumulate on said first electrode into a carrier fluid to create a separate portion.

18. The method to separate a nanocrystal solution sample into separate portions of claim 17,
wherein said electrical field is the smallest feasible electric field, and
wherein said smallest feasible electric field is used to create portions with larger average nanocrystal sizes and wherein the process is repeating with said smallest feasible electric field and then with increased electric fields to create additional portions each with smaller average nanocrystal size.

* * * * *